US009589979B2

(12) United States Patent
Hong

(10) Patent No.: US 9,589,979 B2
(45) Date of Patent: Mar. 7, 2017

(54) VERTICAL AND 3D MEMORY DEVICES AND METHODS OF MANUFACTURING THE SAME

(71) Applicant: MACRONIX INTERNATIONAL CO., LTD., Hsinchu (TW)

(72) Inventor: Shih-Ping Hong, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/548,252

(22) Filed: Nov. 19, 2014

(65) Prior Publication Data

US 2016/0141299 A1    May 19, 2016

(51) Int. Cl.
  *H01L 27/115*  (2006.01)
  *H01L 29/423*  (2006.01)
  *H01L 29/51*   (2006.01)
  *H01L 21/28*   (2006.01)

(52) U.S. Cl.
  CPC .. *H01L 27/11578* (2013.01); *H01L 21/28273* (2013.01); *H01L 21/28282* (2013.01); *H01L 27/1157* (2013.01); *H01L 27/11524* (2013.01); *H01L 27/11551* (2013.01); *H01L 29/4234* (2013.01); *H01L 29/511* (2013.01)

(58) Field of Classification Search
  None
  See application file for complete search history.

(56) References Cited

U.S. PATENT DOCUMENTS

| 6,906,940 | B1 | 6/2005 | Lue |
| 7,315,474 | B2 | 1/2008 | Lue |
| 7,420,242 | B2 | 9/2008 | Lung |
| 7,696,559 | B2 | 4/2010 | Arai et al. |
| 7,851,849 | B2 | 12/2010 | Kiyotoshi |

(Continued)

FOREIGN PATENT DOCUMENTS

| CN | 20370476 | 8/2014 |
| EP | 2048709 A2 | 4/2009 |

(Continued)

OTHER PUBLICATIONS

Hubert et al. A stacked SONOS technology, up to 4 levels and 6nm crystalline nanowires, with gate-all-around or independent gates (φ-Flash), suitable for full 3D integration. Dec. 7-9, 2009. Electron Devices Meeting (IEDM), 2009 IEEE International. pp. 26.7.1-26.7.4.*

(Continued)

*Primary Examiner* — Hoang-Quan Ho
(74) *Attorney, Agent, or Firm* — Haynes Beffel & Wolfeld LLP

(57) ABSTRACT

A memory device is described, which includes a block of memory cells comprising a plurality of stacks of horizontal active lines such as NAND string channel lines, with a plurality of vertical slices penetrated by, and surrounding, the horizontal active lines to provide a gate-all-around structure. A memory film is disposed between the horizontal active lines in the plurality of stacks and the vertical slices in the plurality of vertical slices. A 3D, horizontal channel, gate-all-around NAND flash memory is provided. A method for manufacturing a memory involves a buttress process. The buttress process enables horizontal channel, gate-all-around structures.

20 Claims, 18 Drawing Sheets

(56) References Cited

U.S. PATENT DOCUMENTS

| | | | |
|---|---|---|---|
| 8,058,179 B1 | 11/2011 | Draeger et al. | |
| 8,159,018 B2* | 4/2012 | Akil | H01L 21/28282 257/324 |
| 8,208,279 B2* | 6/2012 | Lue | H01L 27/0688 365/148 |
| 8,363,476 B2 | 1/2013 | Lue et al. | |
| 8,467,219 B2* | 6/2013 | Lue | H01L 27/0688 365/185.05 |
| 8,486,791 B2* | 7/2013 | Lue | H01L 27/11578 257/324 |
| 8,501,609 B2 | 8/2013 | Roizin et al. | |
| 8,501,629 B2 | 8/2013 | Tang et al. | |
| 8,503,213 B2* | 8/2013 | Chen | H01L 27/11573 365/148 |
| 8,513,725 B2* | 8/2013 | Sakuma | H01L 27/11519 257/314 |
| 8,659,944 B2* | 2/2014 | Hung | G11C 16/0466 365/185.05 |
| 8,759,899 B1 | 6/2014 | Lue et al. | |
| 8,890,233 B2* | 11/2014 | Hung | H01L 27/0688 257/324 |
| 8,952,441 B2* | 2/2015 | Sakuma | H01L 29/66825 257/278 |
| 9,053,976 B2 | 6/2015 | Ernst et al. | |
| 9,076,722 B2* | 7/2015 | Sakuma | H01L 21/823431 |
| 9,082,656 B2* | 7/2015 | Chen | H01L 27/1157 |
| 9,087,715 B2* | 7/2015 | Kusai | H01L 27/088 |
| 9,117,848 B2* | 8/2015 | Kusai | H01L 29/66833 |
| 9,177,809 B2* | 11/2015 | Sakuma | H01L 21/28273 |
| 9,196,315 B2* | 11/2015 | Yeh | H01L 21/28282 |
| 2005/0280061 A1* | 12/2005 | Lee | H01L 21/2007 257/296 |
| 2006/0275962 A1* | 12/2006 | Lee | B82Y 10/00 438/152 |
| 2007/0045708 A1 | 3/2007 | Lung | |
| 2007/0252201 A1 | 11/2007 | Kito et al. | |
| 2008/0073635 A1 | 3/2008 | Kiyotoshi et al. | |
| 2008/0175032 A1 | 7/2008 | Tanaka et al. | |
| 2008/0180994 A1 | 7/2008 | Katsumata et al. | |
| 2009/0065850 A1 | 3/2009 | Oh et al. | |
| 2009/0097321 A1 | 4/2009 | Kim et al. | |
| 2009/0184360 A1 | 7/2009 | Jin et al. | |
| 2010/0078701 A1 | 4/2010 | Shim et al. | |
| 2010/0270593 A1 | 10/2010 | Lung et al. | |
| 2011/0169072 A1* | 7/2011 | Lim | H01L 27/105 257/329 |
| 2012/0068241 A1* | 3/2012 | Sakuma | H01L 27/11519 257/314 |
| 2012/0117316 A1* | 5/2012 | Park | H01L 27/115 711/103 |
| 2012/0119283 A1* | 5/2012 | Lee | H01L 27/11519 257/316 |
| 2012/0182806 A1 | 7/2012 | Chen et al. | |
| 2013/0099306 A1* | 4/2013 | Choi | H01L 29/66833 257/329 |
| 2013/0119455 A1* | 5/2013 | Chen | H01L 27/11578 257/324 |
| 2013/0161717 A1* | 6/2013 | Choi | H01L 27/11582 257/314 |
| 2013/0175598 A1* | 7/2013 | Chen | H01L 27/11582 257/324 |
| 2013/0334575 A1* | 12/2013 | Chen | H01L 27/11565 257/202 |
| 2014/0011334 A1* | 1/2014 | Cho | H01L 29/66666 438/253 |
| 2014/0264897 A1 | 9/2014 | Chiu et al. | |
| 2015/0060958 A1* | 3/2015 | Chen | H01L 21/28008 257/288 |
| 2015/0076668 A1 | 3/2015 | Shih et al. | |
| 2015/0214239 A1* | 7/2015 | Rhie | H01L 27/11556 257/321 |
| 2015/0340369 A1* | 11/2015 | Lue | H01L 27/1157 365/185.03 |
| 2015/0340371 A1* | 11/2015 | Lue | H01L 21/28282 257/324 |

FOREIGN PATENT DOCUMENTS

| | | | | |
|---|---|---|---|---|
| EP | 2259306 A1 | 12/2010 | | |
| KR | WO 2011004945 A1 * | 1/2011 | | H01L 27/115 |
| KR | 1020130097562 A | 3/2013 | | |

OTHER PUBLICATIONS

Chen, Chih-Ping, et al., "A Highly Pitch Scalable 3D Vertical Gate (VG) NAND Flash Decoded by a Novel Self-Aligned Independently Controlled Double Gate (IDG) String Select Transistor (SSL)", Jun. 12-14, 2012, 2012 Symposium on VLSI Technology (VLSIT), pp. 91-92.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue, H-T. et al., "A Highly Scalable 8-Layer 3D Vertical-Gate (VG) TFT NAND Flash Using Junction-Free Buried Channel BE-SONOS Device," Jun. 15-17, 2010 Symp. on VLSI Technology, Digest of Technical Papers, pp. 131-132.

Nowak et al., "Intrinsic fluctuations in Vertical NAND flash memories," 2012 Symposium on VLSI Technology, Digest of Technical Papers, pp. 21-22, Jun. 12-14, 2012.

(56) References Cited

OTHER PUBLICATIONS

Tanaka H., et al., "Bit Cost Scalable Technology with Punch and Plug Process for Ultra High Density Flash Memory," Jun. 12-14, 2007 Symp. VLSI Tech., Digest of Tech. Papers, pp. 14-15.
KR Office Action in family member Application No. 10-2015-0028317 dated Feb. 22, 2016, 10 pages.

* cited by examiner

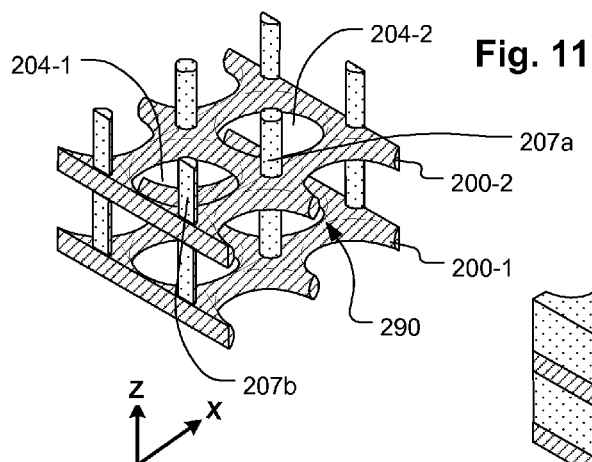
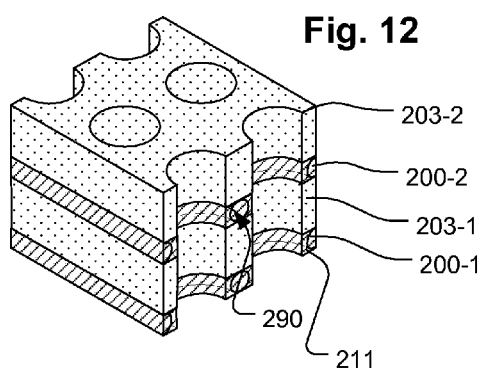
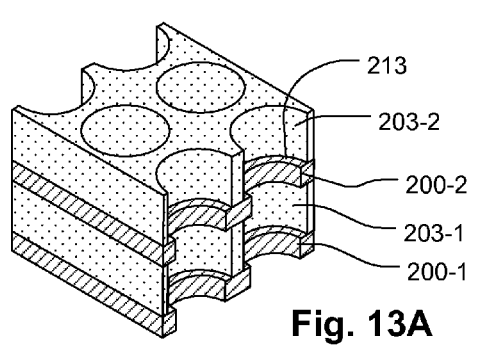
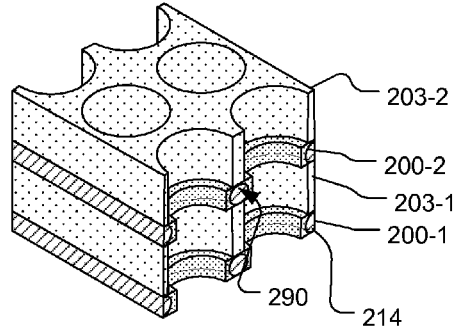
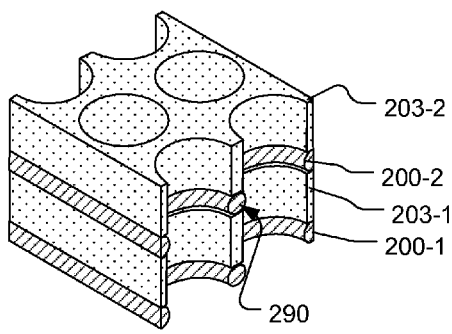

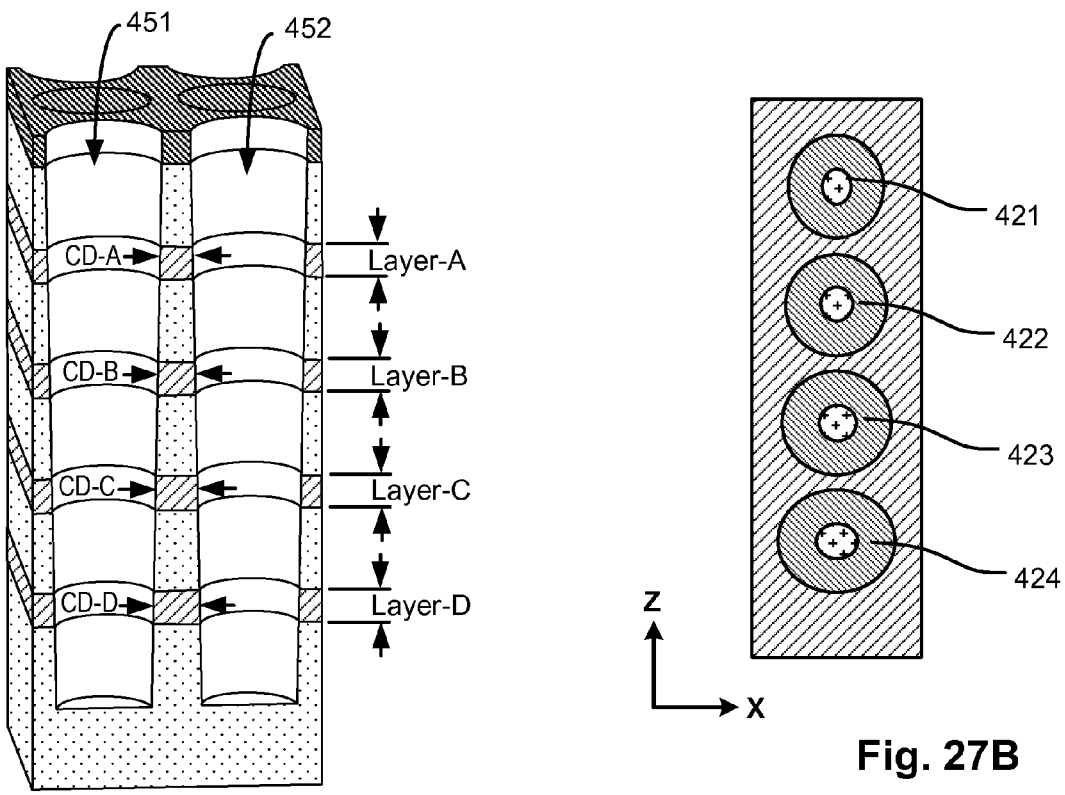
Fig. 27A
Fig. 27B
Conventional
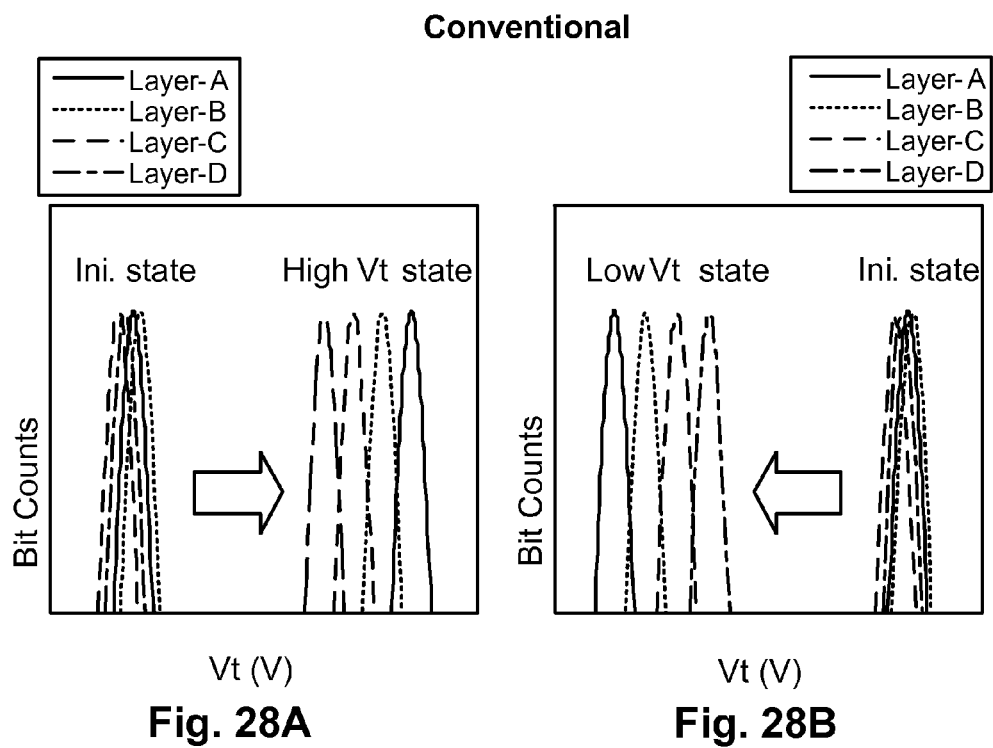
Fig. 28A
Fig. 28B

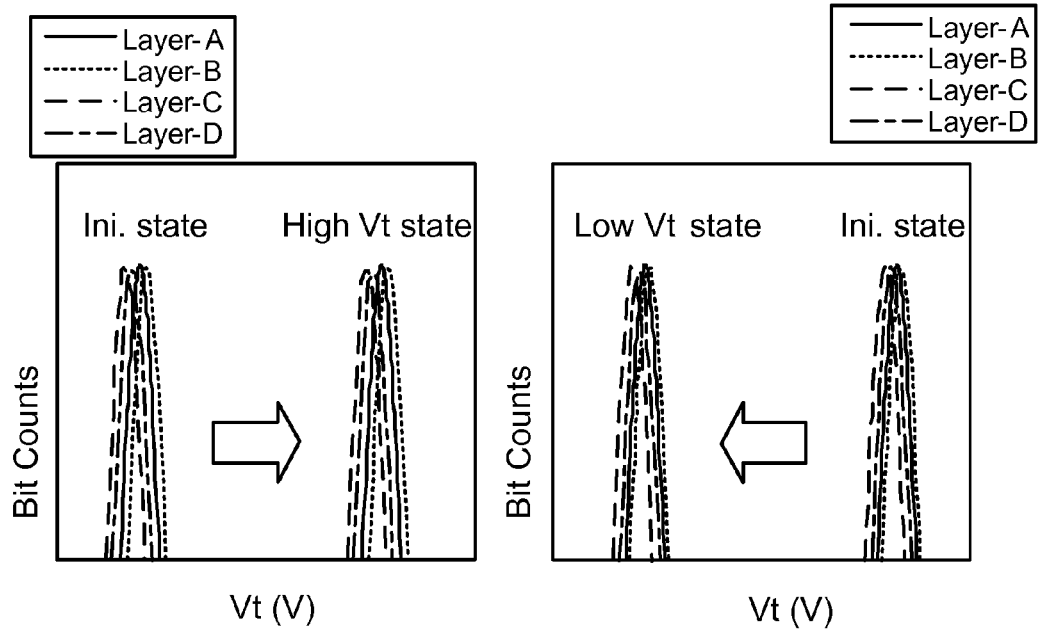
Fig. 29A          Fig. 29B
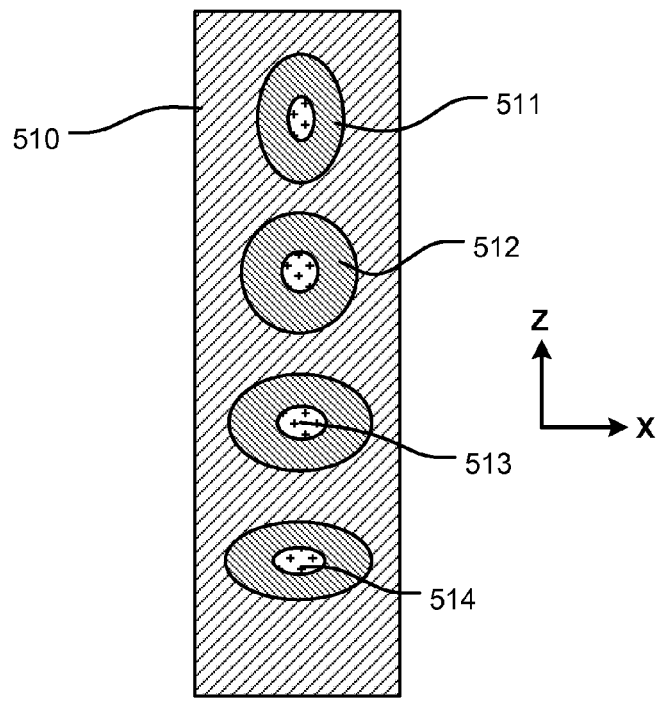
Fig. 30

VERTICAL AND 3D MEMORY DEVICES AND METHODS OF MANUFACTURING THE SAME

BACKGROUND OF THE INVENTION

Field of the Invention

The present invention relates to high density integrated circuit devices. In particular, embodiments according to the present invention provide a method for manufacturing and a structure for a high density device.

Description of Related Art

As critical dimensions of devices in integrated circuits shrink to the limits of common memory cell technologies, designers have been developing techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

In some arrangements, a 3D memory device includes a plurality of ridge-shaped stacks, in the form of multiple strips of semiconductor material separated by insulating material. The strips of semiconductor material are horizontal channels of memory cells in NAND strings, for example. One configuration, including these features referred to as a 3D Vertical Gate (3DVG) architecture, is described below with reference to FIG. 1. See, U.S. Pat. No. 8,503,213, entitled Memory Architecture of 3D Array with Alternating Memory String Orientation and String Select Structures, issued 6 Aug. 2013, by inventors Shih-Hung Chen and Hang-Ting Lue.

Another structure that provides vertical channel, NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009. The structure described in Katsumata et al. includes a vertical channel, horizontal gate NAND, using silicon-oxide-nitride-oxide-silicon SONOS charge trapping technology to create a storage site at each gate/vertical channel interface. The memory structure is based on a column of semiconductor material arranged as the vertical channel for the NAND gate, with a lower select gate adjacent the substrate, and an upper select gate on top. A plurality of horizontal word lines is formed using planar word line layers that intersect with the columns, forming a vertical channel, gate-all-around GAA cell at each layer.

In other embodiments, vertical channels (or NAND bit lines) can be disposed between the strips for vertical NAND string configurations. See for example, U.S. Pat. No. 8,363,476, issued 29 Jan. 2013 (filed 19 Jan. 2011), entitled Memory Device, Manufacturing Method And Operating Method Of The Same, by inventors Hang-Ting Lue and Shi-Hung Chen, which is incorporated by reference as if fully set forth herein.

A number of technologies have been pursued to improve the structure of 3D arrays and the processes for making them, as disclosed in U.S. patent application Ser. No. 13/935,375 filed on 3 Jul. 2013, entitled Damascene Conductor for a 3D Device, by inventors Chia-Jung Chiu and Guanru Lee; and U.S. patent application Ser. No. 14/029,305 filed on 17 Sep. 2013, entitled Conductor with a Plurality of Vertical Extensions for a 3D Device, by inventors Yen-Hao Shih and Hang-Ting Lue; which are incorporated by reference as if fully set forth herein.

The formation of conductive lines that include vertical columns between ridges in high aspect ratio trenches, such as those used in the 3DVG architecture, the vertical NAND architectures and other high density structures, can require complex patterning technologies. The ridge-like stacks formed using trenching techniques can be very narrow. However, the ridge-like stacks can bend or wiggle during the manufacturing process. These problems and other problems associated with the formation of high density stacks can reduce yield.

It is desirable to provide memory cell technologies and technologies for formation of word lines and bit lines for accessing the memory cells, of the type that can be used in complex 3D structures.

SUMMARY OF THE INVENTION

A memory device is described, which includes a block of memory cells comprising a plurality of stacks of horizontal active lines; a plurality of vertical slices penetrated by, and surrounding, the horizontal active lines; and a memory film between the horizontal active lines in the plurality of stacks and the vertical slices in the plurality of vertical slices.

A dielectric charge trapping memory cell, which can be implemented in the block structure for a 3D NAND array of such cells, is described. The memory cell can comprise a horizontal channel line, a dielectric charge trapping structure surrounding the horizontal channel line, and a vertical GAA structure surrounding the multilayer, dielectric charge trapping structure and the horizontal channel line.

A method for manufacturing a memory is described. The method involves a buttress process, and can include the following steps in any practical order:

(1) forming stack of alternating sacrificial layers and active layers, where the active layers can be a semiconductor material to be used as channel lines for memory cells being formed in the array;

(2) forming a first array of holes extending through the stack, the array being arranged in rows and columns of holes to form patterned active layers, where the first array of holes can be a factor in determination of channel lengths for memory cells being formed in the array;

(3) removing material of the sacrificial layers exposed in the holes in the array of holes by an amount which results in formation of an array of posts extending between the patterned active layers, which in combination with the patterned active layers provide a buttress structure;

(4) lining all of, or at least portions of, the patterned active layers in the buttress structure with a memory film, where the memory film can be a multilayer dielectric charge storage structure for memory cells being formed in the array;

(5) filling the buttress structure after said lining, with an active material, where the active material can be a doped semiconductor or other conductive material to be used as word lines for the memory cells being formed in the array; and (6) forming a second array of holes offset from the first array to sever extensions in a word line direction between holes in the first array of holes of the lined active layers to form lined horizontal active lines extending in a first direction, and to separate the active material into vertical slices penetrated by the lined horizontal active lines. The horizontal active lines can be horizontal channels (or NAND string bit lines) for memory cells being formed in the array. The vertical slices of the active material can be GAA word lines which surround the horizontal active lines. A 3D array of horizontal channel, GAA flash memory cells can be made using the processes described herein.

More generally, a method for manufacturing a layered integrated circuit structure of any type is described that includes forming a stack including a sacrificial layer between active layers, and forming a plurality of holes extending through the stack, the plurality of holes resulting in patterned active layers. Then, the sacrificial layer exposed in the holes is removed in the array of holes by an amount which results in formation of a buttress structure including the patterned active layers and an array of supports formed by remaining parts of the sacrificial layer extending between the patterned active layers. The holes can have a variety of shapes and be arranged in a variety of patterns such as a regular array or an irregular array. The shapes and arrangement depend on the desired pattern for the active layers and the desired shapes of the supports. Thus, the holes in the plurality of holes can be circular, rectangular, elliptical or have other shapes. Also the plurality of holes can include holes having different shapes. Then, after formation of the buttress structure, material or materials can be deposited between the active layers around the supports of the buttress structure.

Other aspects and advantages of the present invention can be seen on review of the drawings, the detailed description and the claims, which follow.

BRIEF DESCRIPTION OF THE DRAWINGS

FIG. 11 is a perspective drawing of an assembly in a fourth represented stage of a manufacturing process described herein.

FIG. 12 is a perspective drawing of an assembly formed according to one process for rounding the edges of the active layers as shown in FIG. 11.

FIGS. 13A and 13B are perspective drawings of assemblies formed according to another process for rounding the edges of the active layers showing FIG. 11.

FIG. 14 is a perspective drawing of an assembly formed according to yet another process for rounding the edges of the active layers as shown in FIG. 11.

FIGS. 27A and 27B illustrate aspects of memory cell channel width and channel height which can be affected by the hole type etch which does not have vertical sidewalls.

FIGS. 28A and 28B illustrate program and erase characteristics for an array of memory cells which have different geometries in different layers of the structure.

FIGS. 29A and 29B illustrate desirable program and erase characteristics which can be achieved by techniques described herein.

FIG. 30 illustrates channel cross-section shapes for the gate-all-around memory cells according to an embodiment described herein.

DETAILED DESCRIPTION

A detailed description of embodiments of the present invention is provided with reference to the FIGS. 1-32.

Figure 1:
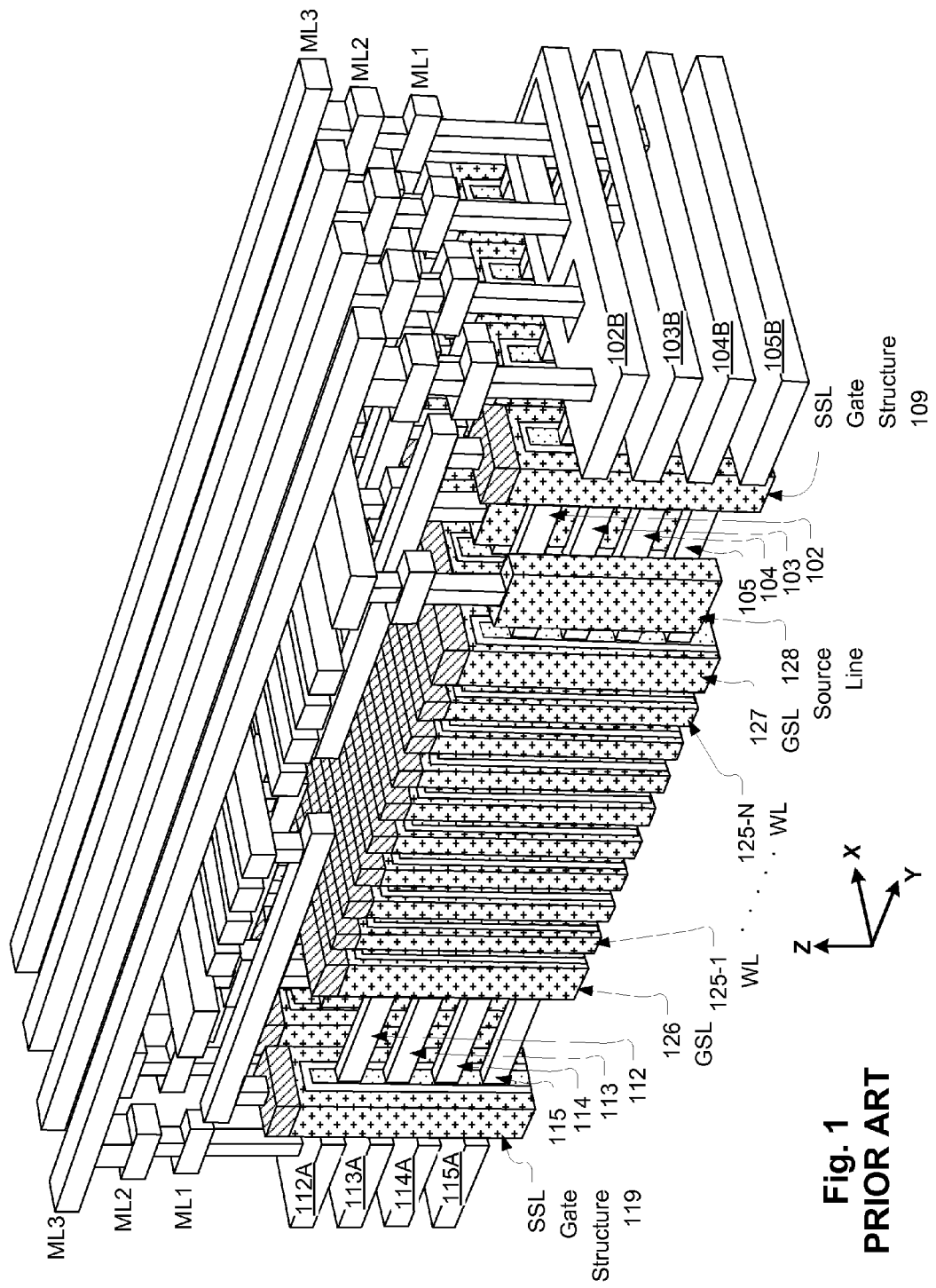
FIG. 1 is a perspective drawing of a 3D vertical gate NAND structure according to the prior art.

FIG. 1 is a perspective illustration of a prior art 3D vertical gate (3DVG) NAND-flash memory array structure as described in U.S. Pat. No. 8,503,213 having multiple layers of horizontal semiconductor strips configured as NAND string bit lines, and multiple patterned conductive lines crossing the strips that act as word lines, with vertical extensions between stacks of strips in the layers. In FIG. 1, insulating material is removed from the drawing to expose additional structure. For example, insulating layers are removed between the semiconductor strips, in the ridge-shaped stacks, and are removed between the ridge-shaped stacks of semiconductor strips.

The multilayer array is formed on an insulating layer, and includes patterned polysilicon layers providing a plurality of word lines 125-1, . . . , 125-N–1, 125-N conformal with a plurality of ridge-shaped stacks. The plurality of ridge-shaped stacks includes semiconductor strips 112, 113, 114, 115. Semiconductor strips in the same plane are electrically coupled together by stairstep structures.

Stairstep structures 112A, 113A, 114A, 115A terminate semiconductor strips, such as semiconductor strips 112, 113, 114, 115. As illustrated, these stairstep structures 112A, 113A, 114A, 115A are electrically connected to different bit lines for connection to decoding circuitry to select planes within the array. These stairstep structures 112A, 113A, 114A, 115A can be patterned at the same time that the plurality of ridge-shaped stacks are defined.

Bit line pads 102B, 103B, 104B, 105B with stairstep contact structures terminate semiconductor strips, such as semiconductor strips 102, 103, 104, 105. As illustrated, these bit line pads 102B, 103B, 104B, 105B are electrically connected to different bit lines for connection to decoding circuitry to select planes within the array. These bit line pads 102B, 103B, 104B, 105B can be patterned at the same time that the plurality of ridge-shaped stacks are defined.

Any given stack of semiconductor strips is coupled to either the bit line pads 112A, 113A, 114A, 115A, or the bit line pads 102B, 103B, 104B, 105B, but not both, in this configuration. A stack of semiconductor strips has one of the two opposite orientations of bit line end-to-source line end orientation, or source line end-to-bit line end orientation. For example, the stack of semiconductor strips 112, 113, 114, 115 has bit line end-to-source line end orientation; and the stack of semiconductor strips 102, 103, 104, 105 has source line end-to-bit line end orientation.

The stack of semiconductor strips 112, 113, 114, 115, terminated at one end by the stairstep structures 112A, 113A, 114A, 115A, passes through SSL gate structure 119, gate select line GSL 126, word lines 125-1 WL through 125-N WL, gate select line GSL 127, and is terminated at the other end by a corresponding source line. The stack of semiconductor strips 112, 113, 114, 115 does not reach the stairstep structures 102B, 103B, 104B, 105B.

The stack of semiconductor strips 102, 103, 104, 105 terminated at one end by the bit line pads 102B, 103B, 104B, 105B, passes through SSL gate structure 109, gate select line GSL 127, word lines 125-N WL through 125-1 WL, gate select line GSL 126, and is terminated at the other end by a source line (obscured by other parts of figure). The stack of semiconductor strips 102, 103, 104, 105 does not reach the bit line pads 112A, 113A, 114A, 115A.

A layer of memory material separates the word lines 125-1 through 125-N, from the semiconductor strips 112-115 and 102-105. Ground select lines GSL 126 and GSL 127 are conformal with the plurality of ridge-shaped stacks, similar to the word lines.

Bit lines and string select lines are formed at the metals layers ML1, ML2, and ML3.

Transistors are formed between the bit line pads 112A, 113A, 114A and the word line 125-1. In the transistors, the semiconductor strip (e.g. 113) acts as the channel region of the device. SSL gate structures (e.g. 119, 109) are patterned during the same step that the word lines 125-1 through 125-N are defined. A layer of silicide can be formed along the top surface of the word lines, the ground select lines, and over the gate structures 109, 119. The layer of memory material can act as the gate dielectric for the transistors. These transistors act as string select gates coupled to decoding circuitry for selecting particular ridge-shaped stacks in the array.

The first metal layer ML1 includes string select lines with a lengthwise orientation parallel to the semiconductor material strips. These ML1 string select lines are connected by interlayer connectors to different SSL gate structures (e.g., 109, 119).

The second metal layer ML2 includes string select lines with a widthwise orientation parallel to the word lines. These ML2 string select lines are connected by interlayer connectors to different ML1 string select lines.

In combination, these ML1 string select lines and ML2 string select lines allow a string select line signal to select a particular stack of semiconductor strips.

The first metal layer ML1 also includes two source lines with a widthwise orientation parallel to the word lines.

The third metal layer ML3 includes bit lines with a lengthwise orientation parallel to the semiconductor material strips. Different bit lines are electrically connected by interlayer connectors to different steps of the stairstep structures connected to bit line pads 112A, 113A, 114A, 115A and 102B, 103B, 104B, 105B. These ML3 bit lines allow a bit line signal to select a particular horizontal plane of semiconductor strips.

A fourth metal layer (not shown—which may be called ML4) can be included for connecting peripheral circuits to the memory array, such as drivers, sense amplifiers, decoders, voltage supply generators and the like.

Interlayer connectors (illustrated but not labeled) in vias between the patterned layers are provided to make connections among nodes and conductors in the multiple patterned conductor layers and other components on the device. In the structure illustrated in FIG. 1, the vertical gate structures are disposed on both sides of each strip, which results in memory cells, which can be characterized as double gate cells, having gates on two sides of the channel strips.

The plurality of ridge-shaped stacks illustrated in FIG. 1 can be implemented using a line type etch pattern, in which the stacks are formed by etching a long trench though a starting stack of materials. In other processes, the stacks can be formed using a hole type etch pattern, in which a pattern of holes is etched through the starting stack of materials. Both approaches have advantages. See, U.S. patent application Ser. No. 14/029,305, entitled "Conductor with a Plurality of Vertical Extensions for a 3D Device," filed 2013 Sep. 17, which application is incorporated by reference as if fully set forth herein.

A buttress process is described herein that can be used to form vertical gate structures which surround the channel strips. The gate structures surrounding the channel strips result in memory cells which can be characterized as gate-all-around GAA cells, where the gate structure surrounds the channel strips. A buttress process can be adapted for making structures that may not include GAA cells.

Figure 2:
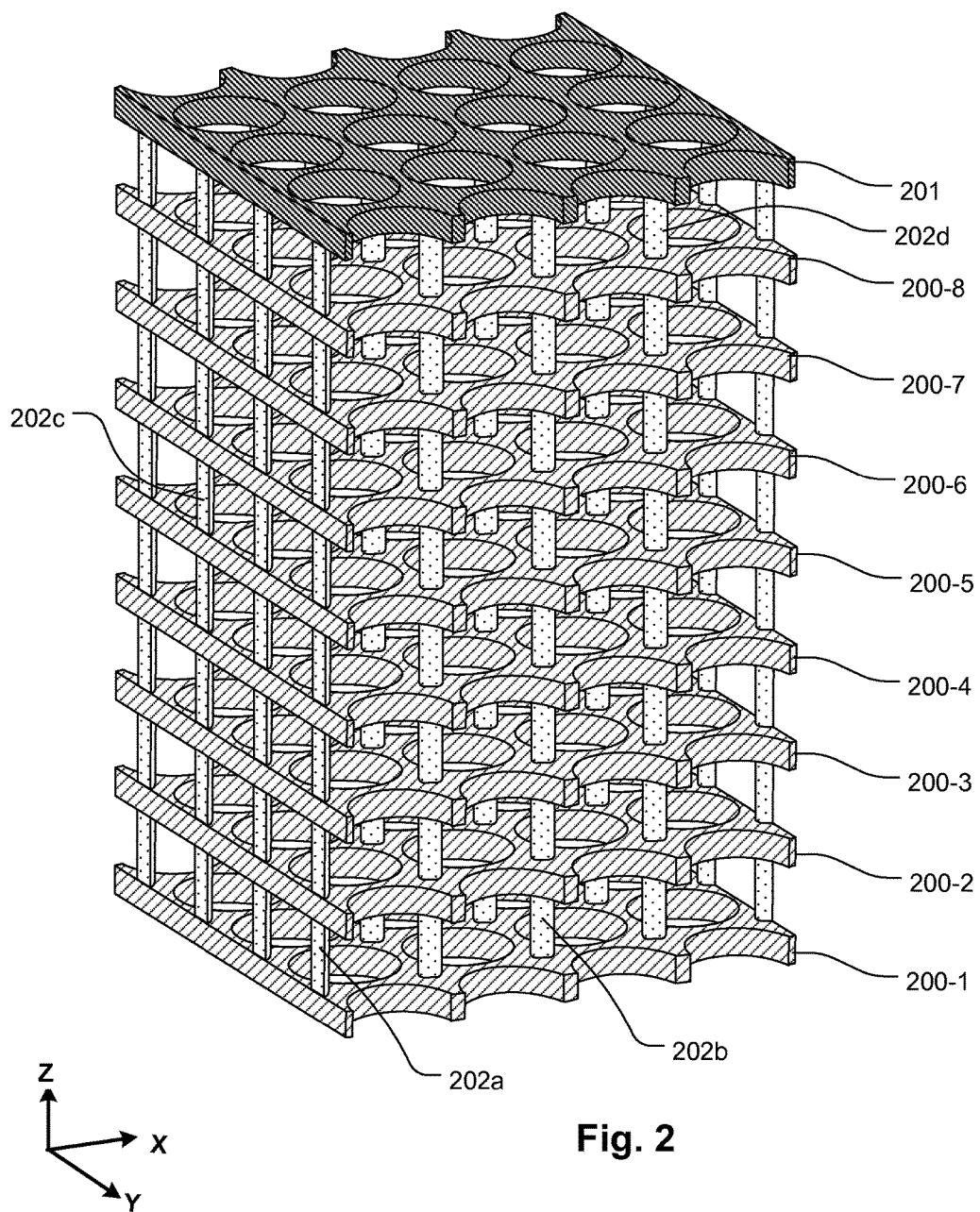
FIG. 2 is a perspective drawing of a 3D buttress structure formed as an intermediate assembly in a manufacturing process described herein.

FIG. 2 is a perspective view of an assembly during an intermediate stage in the manufacturing of a 3D horizontal channel GAA NAND structure utilizing a buttress process.

In many of the figures, including FIG. 2, the X-, Y- and Z-axes are identified for reference. In all the figures, the X-axis indicates the direction of the word line structures within the block, the Y-axis indicates the direction of the bit line structures (channel strips for a NAND string) within the block, and the Z-axis indicates a line normal to the levels or layers (nominally the vertical direction) of memory cells in the block.

FIG. 2 illustrates a stack of semiconductor layers 200-1 through 200-8, and an overlying hard mask layer 201. A pattern of holes is illustrated which passes through the hard mask layer 201, and through the stack of semiconductor layers 200-1 through 200-8. The semiconductor layers 200-1 and 200-8 are referred to as patterned active layers herein as they are used to form active components of the memory cells. In the case of a 3DVG NAND, the semiconductor layers are used to form the channel strips for the NAND strings, sometimes referred to as NAND string bit lines. The active layers can comprise other semiconductor materials or conductive materials, or combinations of materials, which are active in the sense they can be utilized for carrying current according to the purposes of the structure being formed, including use as word lines and bit lines. Representative materials, which can be used alone or in combination for the active layers, include polysilicon, doped polysilicon, single crystalline silicon, metal silicide, metals like Ti, W, Ta, PT, and metal nitrides like TiN, WN, TaN.

An array of posts (e.g. 202*a*, 202*b*, 202*c*, 202*d*) is disposed among the semiconductor layers 200-1 through 200-8. Each of the posts (e.g. 202*a*, 202*b*, 202*c*, 202*d*) is fixed in an upright position (on Z-axis) as a stay or support between the active layers. The posts in the array of posts can comprise insulating materials, or otherwise be configured to block current flow between the active layers. Representative materials, which can be used alone or in combination for the posts, include insulating materials like silicon oxide, silicon nitride, silicon oxynitride, silicon oxycarbide (SiOC), silicon oxyfluoride (SiOF), and other materials utilized for interlayer dielectrics.

The resulting assembly of posts, as shown in FIG. 2 act as a buttress structure which can be used to support the patterned active layers during formation of the bit lines, memory layers, and word lines of the memory structure being manufactured. A manner of manufacturing a buttress structure like that shown in FIG. 2, and for completing a memory structure utilizing the buttress structure, is described with reference to the following figures FIGS. 3 through 20 illustrate aspects of a manufacturing process that can be used to manufacture a memory device using a buttress structure like that shown in FIG. 2. In FIGS. 3 through 20, only two layers and two or four vertical holes are illustrated in order to simplify the drawing. Memory devices utilizing many layers, in some examples 16, 32 or 64 semiconductor layers, can be formed in this manner.

Figures 3, 4:
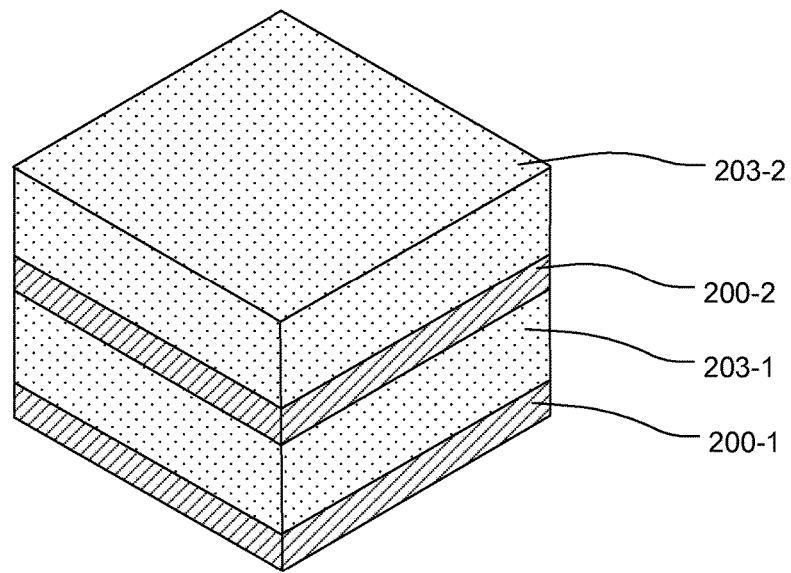
FIG. 3 is a perspective drawing of an assembly in a first represented stage of a manufacturing process described herein.
FIG. 4 is a perspective drawing of an assembly in a second represented stage of a manufacturing process described herein.

FIG. 3 illustrates a stack of alternating sacrificial layers 203-1, 203-2, and semiconductor layers 200-1 and 200-2. These layers can be formed by standard deposition and layer forming techniques. In this example, the semiconductor layers 200-1 and 200-2 are formed utilizing undoped or lightly doped silicon suitable for use as channels in memory cells being formed. For a representative structure, the active layers can comprises a layer of polysilicon having a thickness on the order of 20 to 40 nanometers deposited using a chemical vapor deposition CVD process. The sacrificial layers can consist of a layer of silicon oxide having a thickness on the order of 50 or 70 nanometers deposited using a CVD process. In this example, the sacrificial layers 203-1, 203-2 are formed utilizing silicon dioxide, which is chosen for its compatibility with the active layers, and the ability to be etched selectively over the material of active layers as described below. Thus, other materials can be utilized as the sacrificial layers, such as for example silicon nitride when the semiconductor layers are silicon. The selection of materials used as the sacrificial layers can depend on the materials used for the active layers. It is desirable that the sacrificial layers be implemented using a material which is not conductive, and can act as an insulating post between the active layers.

FIG. 4 illustrates the structure at a stage in manufacturing after formation of an array of holes 204-1, 204-2 extending through the stack. In a more extensive portion of the structure, the array of holes is arranged in rows and columns of holes where the rows can be considered to extend in the word line direction (x-axis), and the columns can be considered to extend in the bit line direction (y-axis) and are offset from one another in the word line direction. This array of holes configuration can be more readily observed with reference to FIG. 2. The etch used to form the array of holes can include first forming a hard mask layer, and patterning the hard mask using a lithographic step, and then using the hard mask, applying a high aspect ratio hole etch. For semiconductor layers comprising silicon and sacrificial layers comprising silicon oxide, a silicon nitride layer can be formed on the top of the stack, as an etch stop for formation of the hard mask. The hole etch can be executed using a pulsed plasma etch process. such as a highly anisotropic dry etch process (etching plasma with fluorine source gases, for example, NF3 and/or SF6, as main etch gas, and carbon source gases, for example, CH2F2, CH4 as additive gases) energized by pulsed radio frequency RF radiation to achieve high aspect ratio hole patterns.

Figure 5:
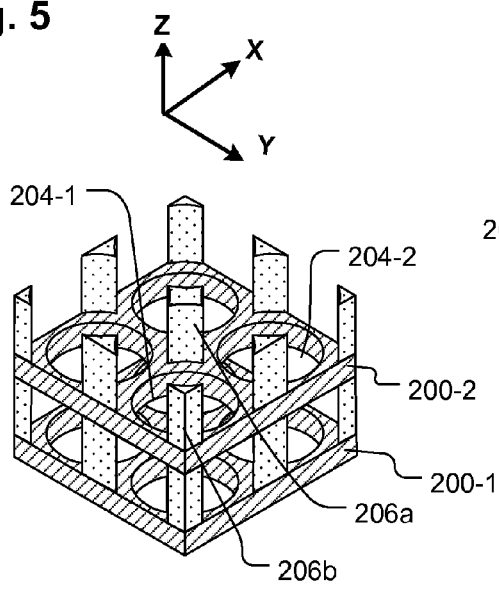
FIG. 5 is a perspective drawing of an assembly in a third represented stage of a manufacturing process described herein.
Figure 6:
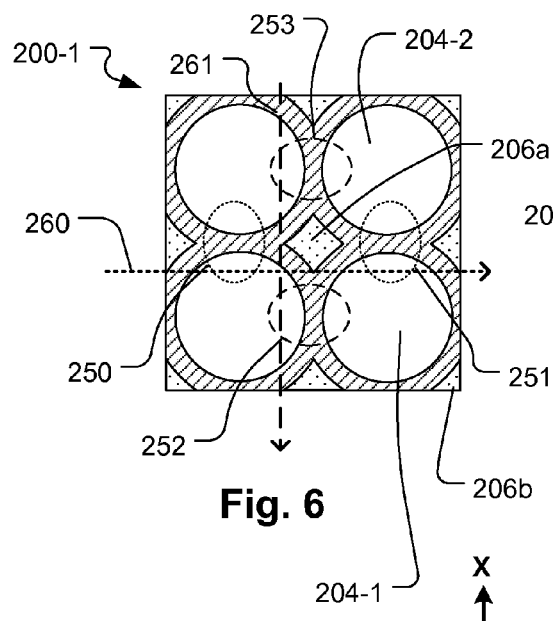
FIG. 6 is a layout view of the assembly shown in FIG. 5.

FIG. 5 is a perspective view and FIG. 6 is a plan view of a buttress structure, similar to that shown in FIG. 2, which is formed by applying an etch process which selectively attacks the sacrificial material. The etch process is applied through the array of holes, and attacks all the sacrificial layers in the stack. The etch to remove the sacrificial material when it is silicon oxide and the active layers are silicon, while leaving the posts, can be an atomic layer etching (ALE) or ALE-like process, such as a so-called "SiCoNi" process (See, for example, U.S. Pat. No. 8,501, 629, which is incorporated by reference as if fully set forth herein). or a so-called "Certas," process (See for example U.S. Pat. No. 8,058,179, which is incorporated by reference as if fully set forth herein). Also, other wet etch processes, like DHF or buffered oxide etch (BOE) can be used. Other selective etch processes can be utilized as well, depending on the materials being used, the dimensions of the target structures, and other factors.

The etch process is timed, or otherwise controlled, so that it removes all of the sacrificial material along lines in the row direction, and along lines in the column direction defined by the array of holes, while leaving the posts (e.g. 206*a*, 206*b*) in regions located on the diagonal lines defined by the shortest line between the perimeters of four adjacent holes in the array. This pattern is described in more detail below. In the example illustrated in FIGS. 5 and 6, the posts have a four sided configuration (see 206*a* in FIG. 6), almost a four-point star configuration, which can result from stopping the etch process shortly after the sacrificial material is removed to form passages in the row and column directions.

Figure 7:
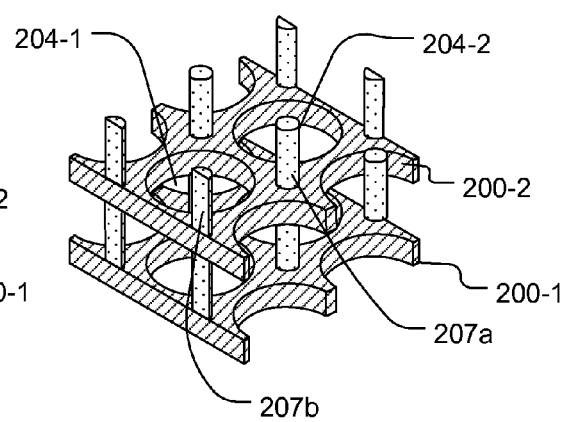
FIG. 7 is a perspective drawing of an assembly in alternative third represented stage of a manufacturing process described herein.
Figure 8:
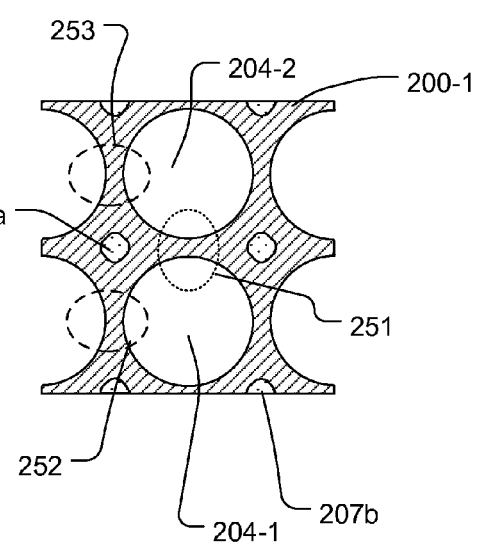
FIG. 8 is a layout view of the assembly shown in FIG. 7.

FIG. 7 is a perspective view and FIG. 8 is a plan view of a buttress structure, similar to that shown in FIG. 2, and in FIGS. 5 and 6, likewise formed by applying an etch process which selectively attacks the sacrificial material. The etch process is applied through the array of holes, and attacks all the sacrificial layers in the stack. The etch process is timed or otherwise controlled as described above with reference to FIG. 5. In the example illustrated in FIGS. 7 and 8, the posts have a rounded configuration (see 207*a*, 207*b* and FIG. 8). The structure can result from an etch process which overetches relative to the process of FIGS. 5 and 6. The pattern chosen for the posts can be determined as suits the needs of a particular manufacturing process and structure being formed. The embodiment of FIGS. 7 and 8 provides more room for formation of materials in the buttress structure, while the embodiment of FIGS. 5 and 6 may provide better structural support during the manufacturing process.

Referring to FIGS. 6 and 8, features of the structure of each of the semiconductor layers (e.g. layer 200-1) in this example can be described. The semiconductor layers have a post (206a, 207a) in a buttress area with four extensions. The extensions are given the same reference in both figures for ease of description while it is understood that their specific structure may be different. The four extensions from the buttress areas of posts 206a or 207a include extensions 250 and 251 which extend at 0° and 180° along a line in the bit line direction, as represented by the arrow 260. The four extensions from the buttress areas of posts 206a or 207a include extensions 252 and 253 which extend at 90° and 270° along a line in the word line direction, as represented in FIG. 6 by the arrow 261. The extensions 250 and 251 in the bit line direction are configured to act as the channel regions in memory cells on those extensions. Together along the bit line direction, these extensions form a semiconductor strip which can act as a NAND string bit line or channel, in a 3D flash structure. The extensions 252 and 253 along the word line direction are severed in a subsequent process step or subsequent process steps.

Figure 9:
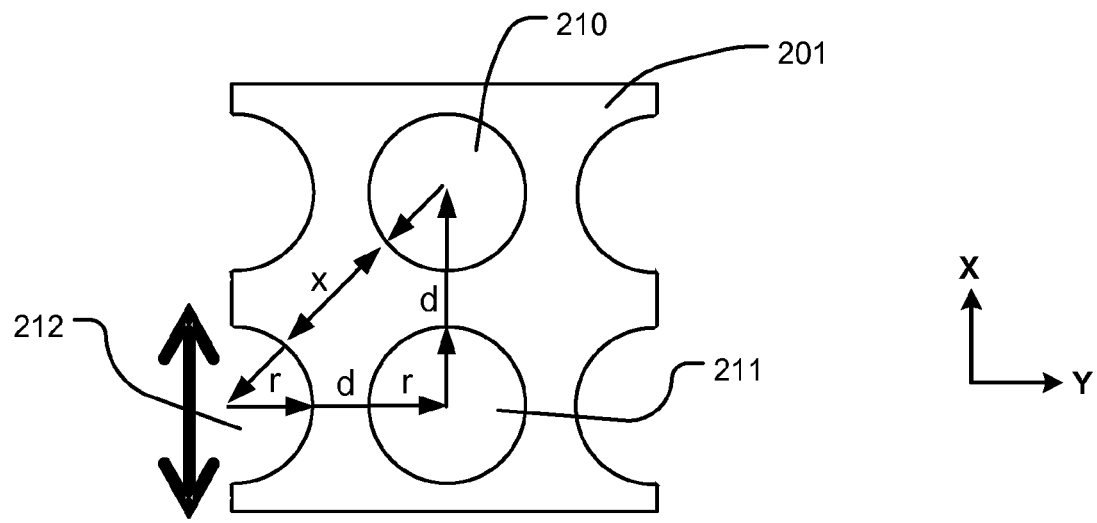
FIG. 9 is a view in layout of a mask pattern for a first array of holes.
Figure 10:
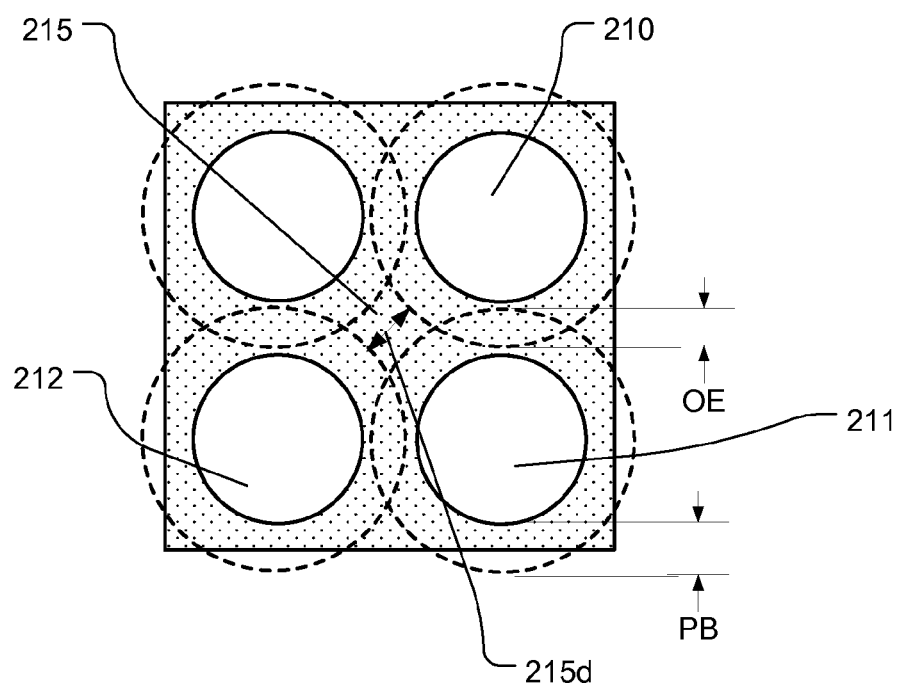
FIG. 10 is referred to for a discussion of the etch process used in removal of the sacrificial layer, resulting in formation of an array of posts as illustrated in FIGS. 5 and 7.

FIGS. 9 and 10 are referred to for the purposes of explaining parameters for the etch process used to form the posts as shown in FIGS. 5-8. FIG. 9 is a layout view of the array of holes in the hard mask layer 201, showing the spacing among the holes, and the bit line pitch for the structure being formed. The holes in the array, including holes 210, 211, 212 are circles in this example having an equal radius "r." The distance "d" between the holes in the word line direction (X-axis) is the same as the distance "d" between the holes in the bit line direction (Y-axis). The diagonal line taken between the centers of the hole 210 and the hole 212, which is also the line between the closest points on the perimeters of the holes, has a length which is twice the radius "r" plus the distance "x" which is equal to the distance between the closest points on the circumferences of the holes 210, 212. The distance "x" must be greater than the distance "d" by at least the width along the diagonal of the post being formed.

Thus, as illustrated in FIG. 10, an etch process can be applied to remove the sacrificial material for a distance PB perpendicular to the tangent of the circumference of the holes. This distance PB results in over etch OE in the illustrated example which is sufficient to form a wide passage in the word line direction, and a wide passage in the bit line direction according to the needs of the structure being formed. The distance PB however is less than one half of the distance "x" illustrated with respect to FIG. 9. This results in a region 215 in which a post is formed, having a width 215b on the diagonal that is equal to (x−2*PB). As mentioned above, with respect to FIG. 8, further over etching can result in rounding of the profile of the post, as well as reducing its diameter.

As a result of the etching process, a buttress structure such as shown in FIGS. 5 and 7 can be formed.

As mentioned above, semiconductor layers 200-1 and 200-2 are used in this example to form the channel strips, or NAND strip bit lines, in the memory structure. It can be desirable for some types of memory material to apply a process to round the edges of the semiconductor layers 200-1 and 200-2, at least on the edges exposed by the array of holes. FIGS. 11, 12, 13A, 13B and 14 are referred to for the purposes of illustrating various techniques for rounding the edges.

FIG. 11 illustrates the structure after rounding the edges of the structure of FIG. 9. Reference numerals applied to FIG. 7 are also given to the corresponding structures in FIG. 11. However, after a rounding process which selectively rounds the edges of the semiconductor layers, the channel cross-sections (e.g. as can be seen in the channel 290) of the extensions of the material between the holes is rounded. This results in the cross-section of the channel of the memory cells being formed having the rounded profile, which can improve the electric field distributions during read, program and erase processes.

In FIG. 12, a technique for forming rounded edges is illustrated. In this technique, the structure at the stage illustrated in FIG. 4 is exposed to an oxidizing atmosphere, which oxidizes the semiconductor layer. In this example, where the semiconductor layer comprises silicon, and the sacrificial layer comprises silicon dioxide, the oxidized exposed region of the semiconductor layer (e.g. 211) also comprises silicon oxide. In this case, during an etch process which removes the sacrificial layer, the oxide layer 211 is also removed, leaving rounded edges like those shown in FIG. 11.

FIGS. 13A and 13B illustrate another process for rounding the edges. In the process of FIGS. 13A and 13B, starting with the structure like that shown in FIG. 4, an etch process is applied to etch back the sacrificial layers slightly, leaving ledges (e.g. 213) exposed in the semiconductor layers 200-1, 200-2. Next, as illustrated in FIG. 13B, the process is applied to oxidize the exposed edges and ledges 213 of the semiconductor layers 200-1, 200-2 to form an oxide layer 214. In this example, where the semiconductor layer comprises silicon, and the sacrificial layer comprises silicon oxide, the oxidized layer 214 of the semiconductor layer (e.g. 211) also comprises silicon oxide. In this case, during an etch process which removes the sacrificial layer, the oxide layer 214 is also removed, leaving rounded edges like those shown in FIG. 11.

FIG. 14 illustrates yet another process for rounding the edges. In the example of FIG. 14, starting with a structure like that shown in FIG. 13A, leaving ledges (e.g. 213) exposed in the semiconductor layers 200-1, 200-2, and a process is applied which selectively etches the semiconductor layer in the presence of the sacrificial layer. One example process that can selectively round the silicon layer is an HNA system (HF:Nitric:Acetic) isotropic wet etching of silicon is a combination of nitric acid and hydrofluoric acid, with acetic acid or ammonium fluoride added as a buffer. This can result in direct rounding of the edges so that the channel 290 in the patterned semiconductor layer is rounded. In other approaches, the structure can be exposed to a number of repeated cycles of removing small amounts of the sacrificial layer, followed by slight rounding of the exposed semiconductor by isotropic wet etching in each cycle.

Referring back to FIG. 2 and FIGS. 5 and 7, the removal of the sacrificial material, while leaving the array of posts, results in formation of row passages between the active layers communicating between holes arranged in the rows, and formation of column passages between the active layers communicating between holes arranged in the columns. A passage is said to be communicating between holes when the sacrificial material has been completely removed or has been removed to such a degree along the line between the holes that an opening is left in which deposition of conductor material or semiconductor material can be accomplished in subsequent steps.

Figure 15:
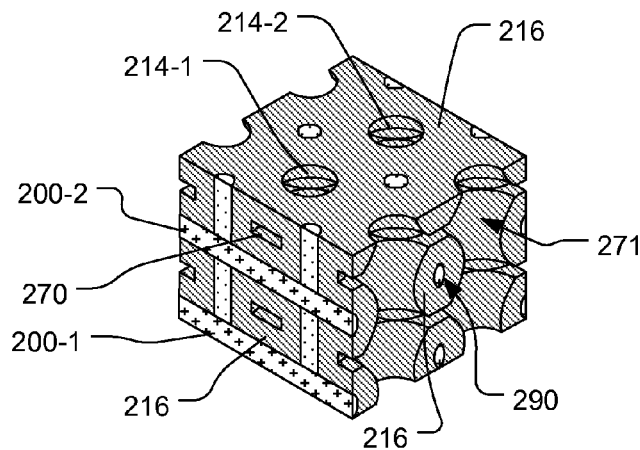
FIG. 15 is a perspective drawing of an assembly in a fifth represented stage of a manufacturing process described herein.

FIG. 15 illustrates a stage in the process, after applying memory film 216, in a process which lines the buttress structure, at least on the surfaces in the regions (e.g. 250, 251 of FIG. 6, FIG. 8) at which memory cells are being implemented. The formation of memory film 216 results in an information storage structure on the channel regions at least in the semiconductor layers. In the illustrated example, the memory film 216 lines all the surfaces of the buttress structure, including the surfaces on the top side and bottom side of each of the semiconductor layers, the surfaces of the buttressed posts, and the surfaces to be used as channel strips. The memory film 216 is illustrated as a single layer in FIG. 15, for ease of drawing. In a flash memory embodiment, the memory film 216 is a multilayer dielectric structure, including a tunneling layer, a charge trapping layer, and a blocking layer. In some examples known as BE-SONOS, the tunneling layer in the dielectric charge storage layer can comprise a first layer of silicon oxide less than about 2 nanometers thick, a layer of silicon nitride less than about 3 nanometers thick and a second layer of silicon oxide less than about 3 nanometers thick. The charge trapping layer can comprise a layer of silicon nitride having a thickness of about 5 to 7 nanometers. The blocking layer can consist of a layer of silicon oxide having a thickness of about 5 to 8 nanometers thick. In a representative embodiment, a BE-SONOS charge trapping structure is utilized having a combined thickness between 15 and 25 nm, or more specifically about 20 nm might be utilized, for example. Atomic layer deposition technologies can be used to form the BE-SONOS charge trapping structure in a manner that is sufficiently conformal such that uniform memory layers are established at least in the channel regions of the memory cells being formed. One example process is plasma enhanced atomic layer deposition (PEALD), that utilizes typical PECVD process gases and tooling while delivering improved topography coverage and excellent thickness control. For example, a PEALD SiN process consists of exposing the Si wafer to repetitions of a sequence consisting of $N_2$ plasma exposure, gas purging, non-plasma activated $SiH_4$ exposure, and gas purging. In one example, an ONO charge trapping structure is implemented. The ONO structure can be implemented using first oxidation of the semiconductor layer to form the tunneling layer oxide, deposition using an atomic layer deposition technique of silicon nitride over the tunneling layer to form the charge trapping layer, and oxidation of the silicon nitride layer to form the blocking layer.

In alternative embodiments, the tunneling layer may consist of a single layer of silicon oxide. Also, in alternative embodiments, the blocking layer may consist of a layer of tantalum oxide, a layer of aluminum oxide, or other materials or combinations of materials can be used.

A wide variety of charge trapping structures can act as the memory material. Also, other types of memory materials can be used. For example, embodiments can use transition metal oxide or other programmable resistance material as the memory film 216.

The layer of memory film 216 must be thin enough that the holes 214-1, 214-2 remain as the result of a partial filling of the holes 204-1, 204-2 in the array of holes aligned in the vertical direction, and the passages (e.g. 270) through the buttress structure in the word line direction are not completely closed, but leave sufficient space for deposition of an active material, such as material suitable to provide word line structures for a 3D NAND. Representative active materials which can be used include doped polysilicon, metal, metal nitrides, metal silicides and combinations of silicon, silicides and metal. Passages (e.g. through the region 271) in the bit line direction also remain at least partially open in some embodiments. The dimensions of the passages are determined by a variety of factors, including the geometry of the holes 204-1, 204-2 in the array of holes, the spacings between the holes in both the bit line and word line directions, the thicknesses of the memory film 216, the thickness of the sacrificial layers which translates into the distance between the layers of semiconductor material, the thicknesses of the layers of semiconductor material, and so on.

Figure 16:
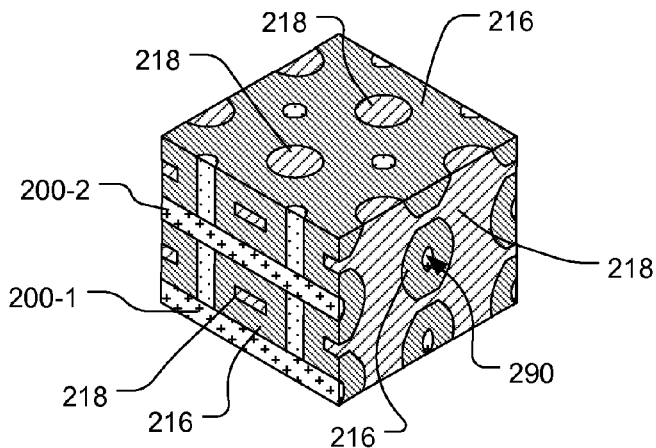
FIG. 16 is a perspective drawing of an assembly in a sixth represented stage of a manufacturing process described herein.

FIG. 16 illustrates a stage in the process after deposition of the active material 218 into the holes (e.g. 214-1, 214-2) and the passages (e.g. 270, 271) illustrated in FIG. 15. In this example, the active material can comprise a word line material like polysilicon deposited using a process which supports high aspect ratio hole filling. A representative process can be an atomic layer deposition technique, such as hydrogen radical-enhanced ALD or plasma-enhanced ALD. As a result of the deposition of the active material 218, the buttress structure is filled by a three-dimensional matrix of active material connected through the vertical holes (e.g. 214-1, 214-2) and through the horizontal passages (e.g. 270, 271) which remain after deposition of the memory film 216.

Figure 17:
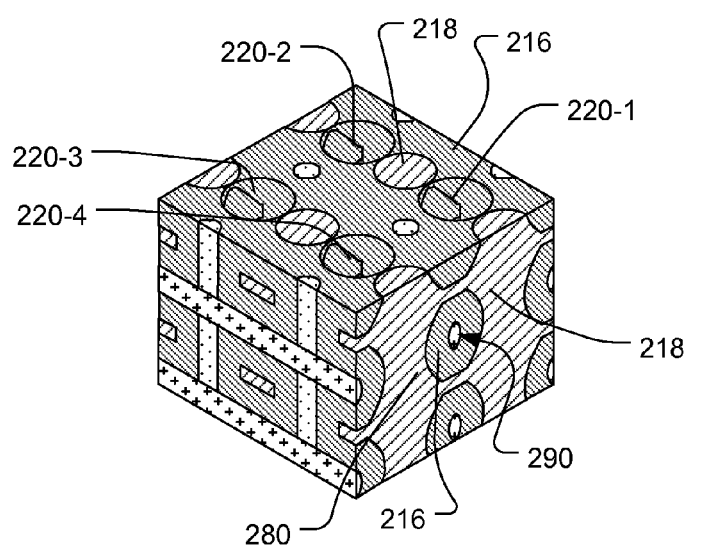
FIG. 17 is a perspective drawing of an assembly in a seventh represented stage of a manufacturing process described herein.

FIG. 17 illustrates a stage in the process after performing a patterned etch of a second array of holes (220-1, 220-2, 220-3, 220-4), through the filled buttress structure. The materials in the field buttress structure include the active material 218 (e.g. polysilicon for word lines), the memory film 216 (e.g. ONO), and the material of the layers of semiconductor material (e.g. polysilicon for channels). Referring to FIGS. 6 and 8, the second array of holes is offset from the second array of holes on a line parallel to the Y-axis, configured to sever the extensions of the patterned semiconductor layers in the word line direction, such as extensions 252, 253 in the layer of semiconductor material. Also, the second array of holes is configured to divide the matrix of active material 218 into a set of individual vertical slices in the X-Z plane of the illustrated coordinate system, which are penetrated by the extensions (e.g. 250, 251 of FIGS. 6 and 8) in the bit line direction of the semiconductor layers, with the memory film disposed in between. The structure results in a memory cell (e.g. 280) at the crosspoints of the vertical slices of active material and the extensions of the semiconductor layers in the bit line direction. As illustrated in FIG. 17, the memory cell 280 has a gate-all-around GAA structure on a horizontal channel, where the memory film 216 surrounds the channel 290 in the semiconductor layer, and the vertical slice of word line material surrounds the memory film.

Figure 18:
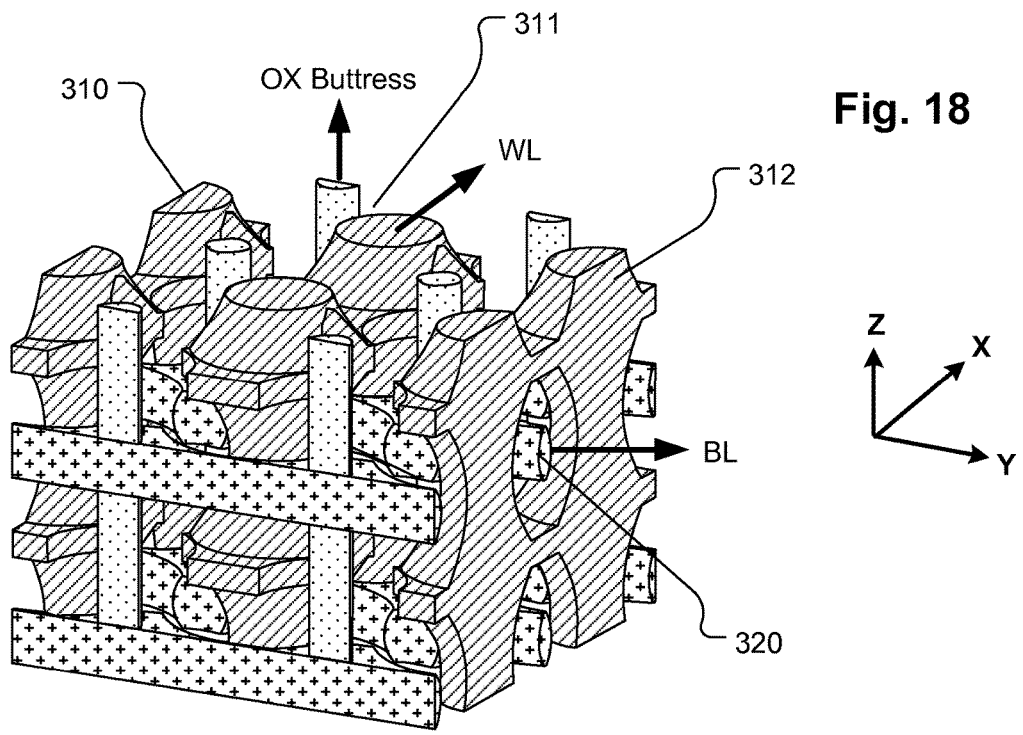
FIG. 18 is a perspective drawing of a structure with the memory film removed for the purposes of illustrating certain features.
Figure 19:
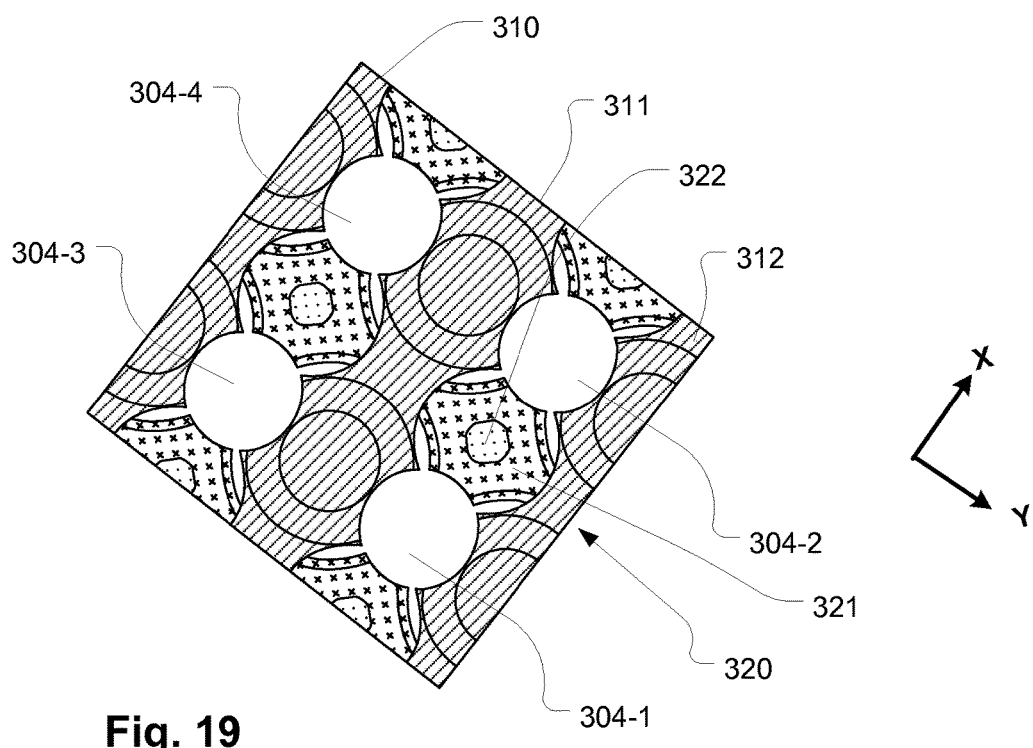
FIG. 19 is a layout view of the structure shown in FIG. 18, with the memory film removed.

FIGS. 18 and 19 provide a perspective view of the structure with the memory film 216 removed, so that the NAND bit line strips and word line slices can be more readily observed. Three word line slices 310, 311, 312 are illustrated, where the slices 310 and 312 are cut in the middle to show cross-sectional shapes. The channel line 320 in the patterned active layer penetrates the vertical slice 312, as illustrated. FIG. 19 illustrates the structure in plan view with the buttress posts (e.g. 322) positioned over a buttress region 321 of the bit line strip that includes the exposed buttress region 321. Holes 304-1, 304-2, 304-3, 304-4 correspond with the holes to 220-1, 220-2, 220-3, 220-4 of FIG. 17, and sever the extensions in the word line direction of the layers of semiconductor material, and the extensions of the word line material in the bit line direction, as discussed above. As result, the remaining portions of the semiconductor layers comprise a plurality of stacks of semiconductor strips which can be configured as NAND strings. The remaining portions of the active material comprise a plurality of slices of word line material through which the semiconductor strips extend, and which surround the channel regions of the memory cells formed in the semiconductor strips in the three-dimensional array.

Figure 19A:
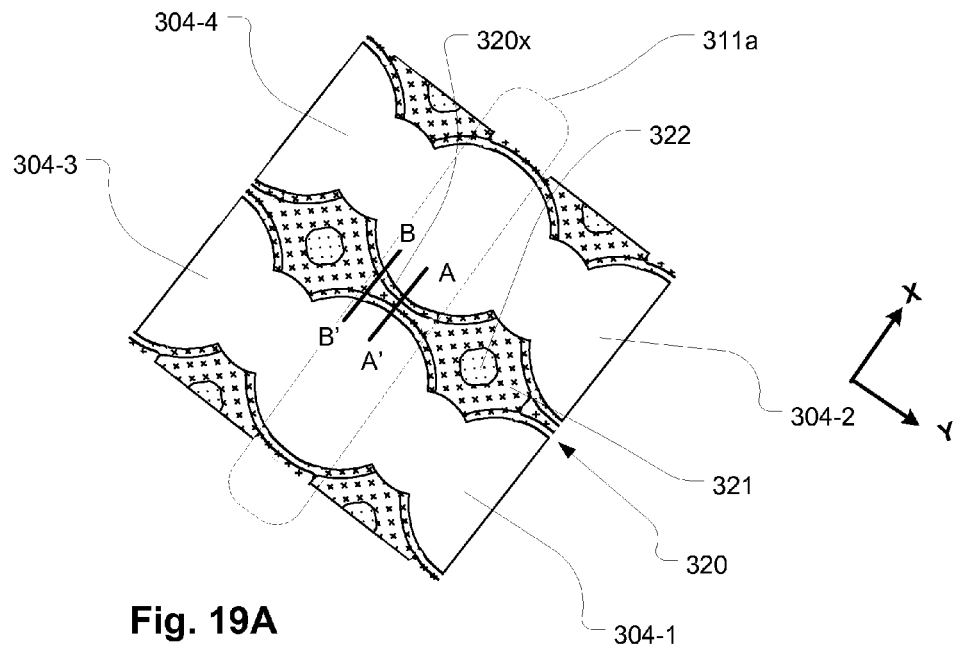
FIG. 19A is a layout view of the structure shown in FIG. 19, with the word line strips removed.
Figure 19B:
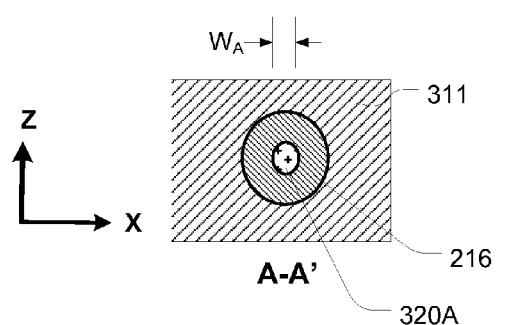
FIGS. 19B and 19C are cross-section views taken on the A-A' and B-B' lines of the layout shown in FIG. 19A.
Figure 19C:
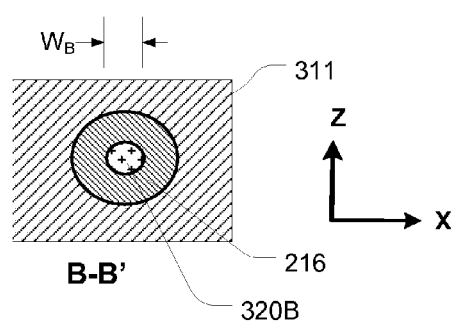

FIG. 19A takes the layout view of FIG. 19, and removes the word line slices 310, 311, 312, and as a result illustrates a top view shape of the bit line strips (e.g. strip 320). Word line strip 311 is removed from the region 311a in the drawing. The bit line strip 320 includes a channel region 320x in the region 311a. The sides of the bit line strips are not straight in the channel region (e.g. 320x) in the illustrated example, and can be arcuate or have other cut out shapes as a result of the hole shapes used in the formation. As a result of this shape, the bit line strips have sides with undulating shapes, and are more narrow in the cross-section A-A' near the center of the word line strip region 311a than in the cross-section B-B' near the edges of the word line strip region 311. FIG. 19B shows a cross-section 320A of the bit line strip 320 taken on line A-A', surrounded by the memory film 216 and word line strip 311. As seen, the width of the bit line strip at cross-section 320A near the center of the word line strip region is labeled $W_A$. FIG. 19C shows a cross-section 320B of the bit line strip 320 taken on line B-B', surrounded by the memory film 216 and word line strip 311. As seen, the width of the bit line strip at cross-section 320B near the edge of the word line strip region is labeled $W_B$. The width $W_A$ is substantially less than the width $W_B$. Also, the word line strip 311 as shown in FIGS. 19B and 19C surrounds, and is conformal with, the outside surface of the memory film in both cross-section 320A and cross-section 320B, establishing a gate-all-around GAA cell.

Figure 20:
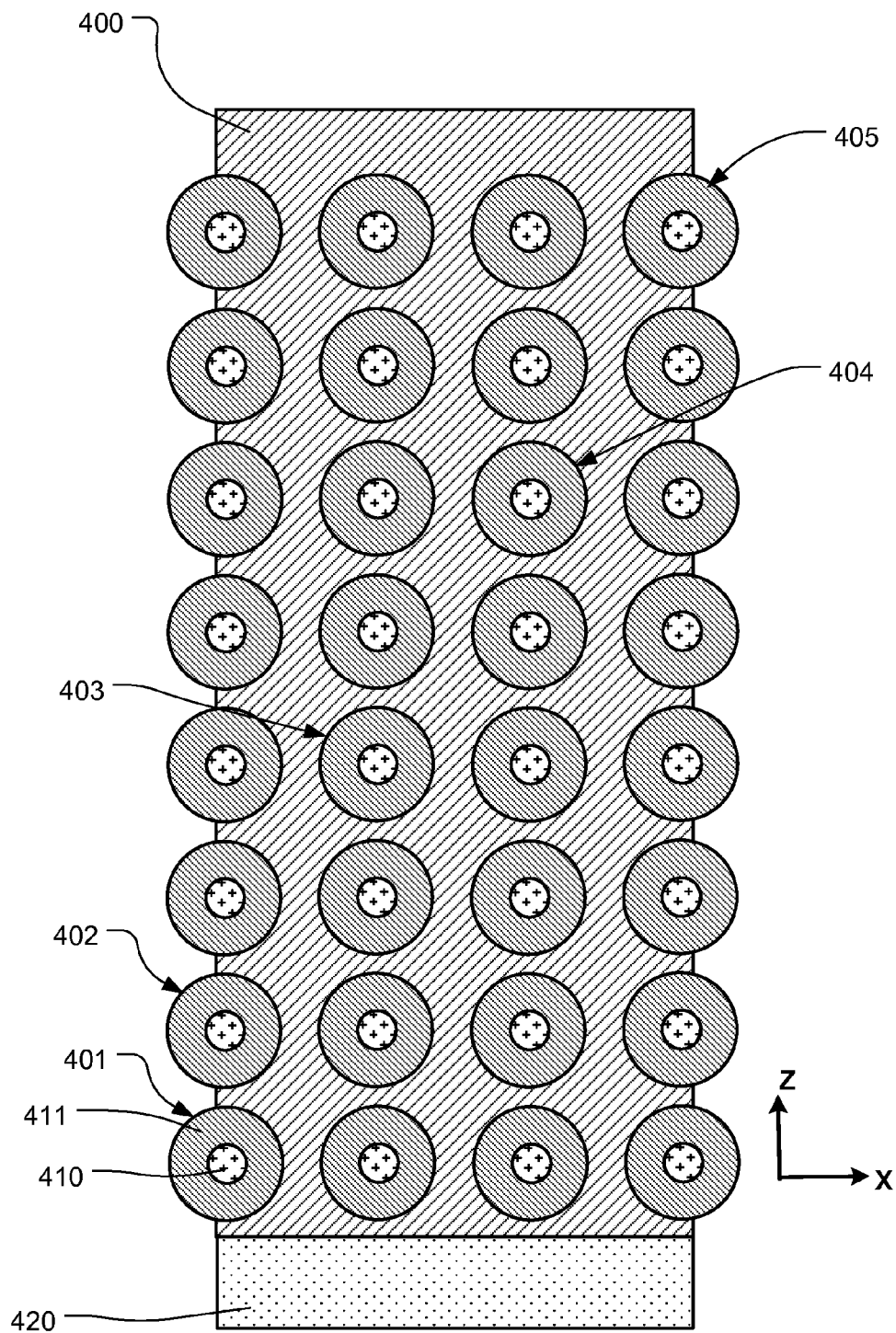
FIG. 20 is a cross-section view taken in the X-Z plane illustrating an array of gate-all-around memory cells penetrating a vertical slice word line.

FIG. 20 is a cross-sectional view corresponding to the X-Z face shown in FIG. 17, taken in the X-Z plane of a 3D array with eight layers of memory cells through a word line slice 400, formed on an insulating layer 420 of a substrate. In the illustration, the memory cells include cells 401, 402 in first and second levels of a first stack, cell 403 in a fourth level of a second stack, cell 404 in a sixth level of a third stack, and cell 405 in an eighth level of a fourth stack. The cells include a channel region in a semiconductor strip, and a memory film, which is surrounded by the word line material in the slice 400. Referring to cell 401, the channel region 410 is shown as circular, and the memory material 411 surrounds the circular channel region 410. For simplicity, all of the cell dimensions are shown as the same in this diagram. It illustrates that the buttress structure can be used to form a high density, gate-all-around memory structure with many levels.

Figure 21:
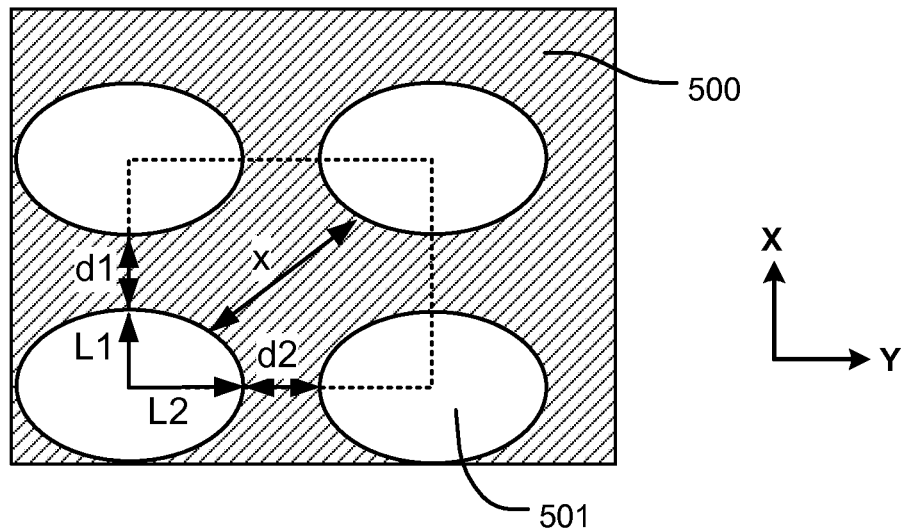
FIGS. 21-25 illustrate alternative layout patterns for the first array of holes mentioned above.

FIGS. 21-25 illustrate a variety of configurations for the first array of holes, corresponding to the holes 204-1, 204-2 of FIG. 4. The configuration of the holes in the first array of holes can be determinative of the memory cell structures and other structures in this device that are implemented using the buttress, and of the shapes of the posts in the buttress structure. Each of the figures shows a mask 500 which defines the shape of the holes. In FIG. 21, the hole 501 is elliptical. A dimension "L2" defines the distance in the bit line direction from the center of the hole, to the perimeter of the hole. A dimension "L1" defines the distance in the word line direction from the center of the hole, to the perimeter of the hole. A dimension "d1" defines the distance in the word line direction between the perimeters of the holes in the array. A dimension "d2" defines the distance in the bit line direction between the perimeters of the holes in the array. A dimension "x" defines the distance in the diagonal direction between the perimeters of the holes in the array, which are spaced one row over in the bit line direction and one column up in the word line direction. The dimensions "L1" and "L2" can be set to determine channel length and word line width in the array structure. The dimensions "d1" and "d2" can be set to equal values, or different values as suits a particular implementation. These dimensions tend to affect the amount of etching time required in the formation of the posts for the buttress structure. The dimension "x" must be greater than the sum of "d1" and "d2" by at least the diameter of the post to be formed. These same dimensions are labeled in each of the example shown in FIGS. 21-25.

Figure 22:
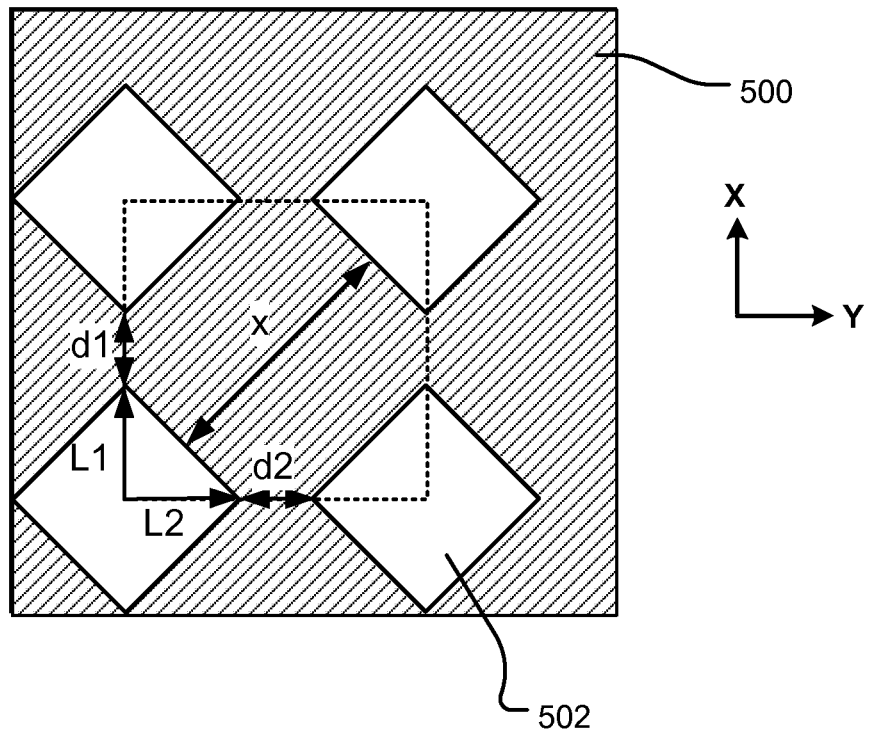
Figure 23:
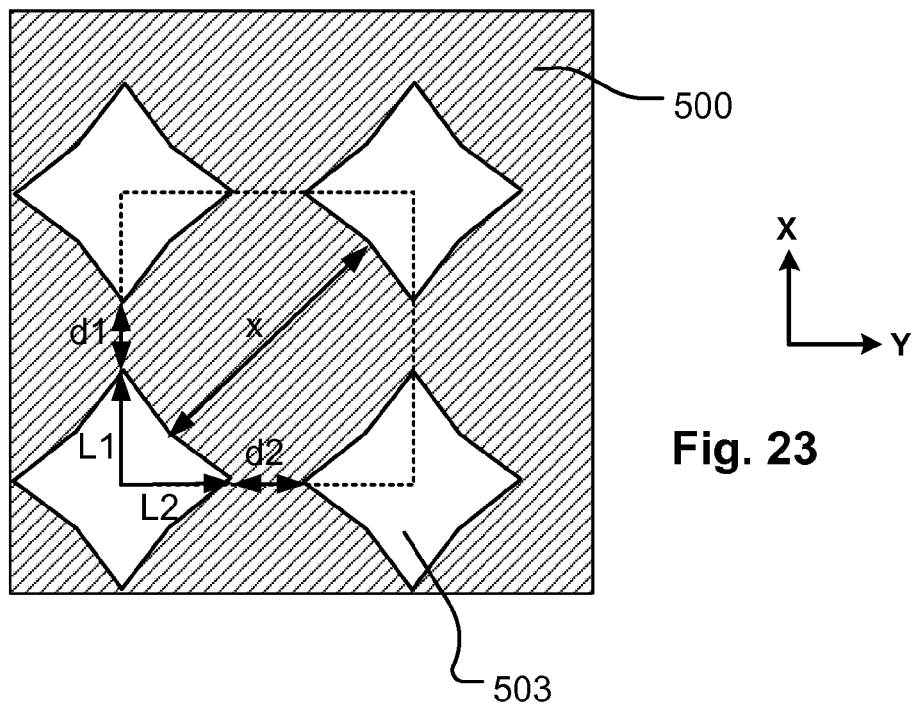
Figure 24:
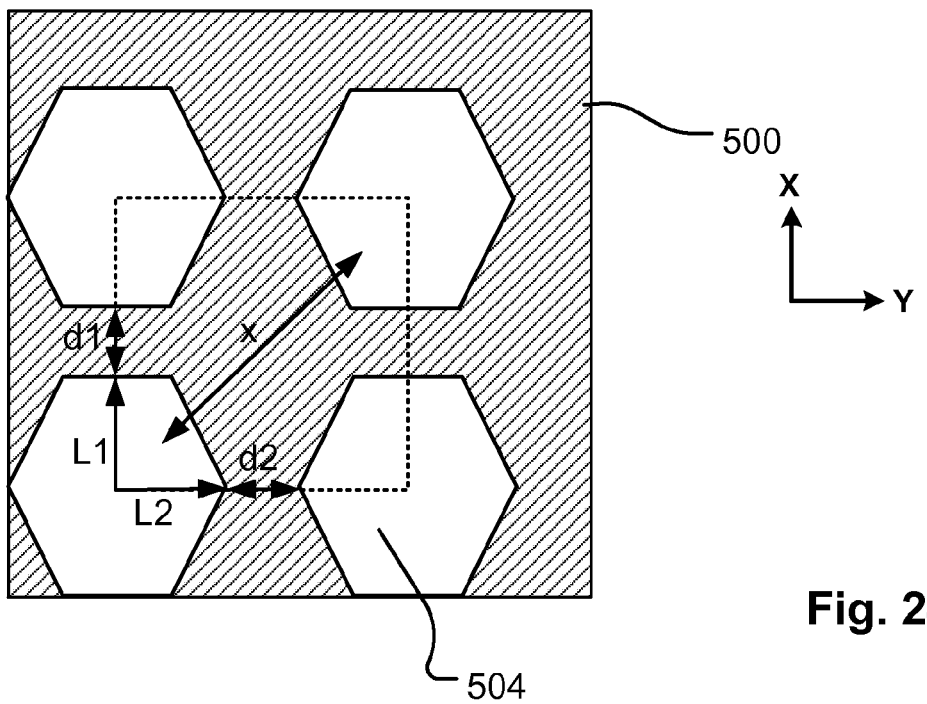
Figure 25:
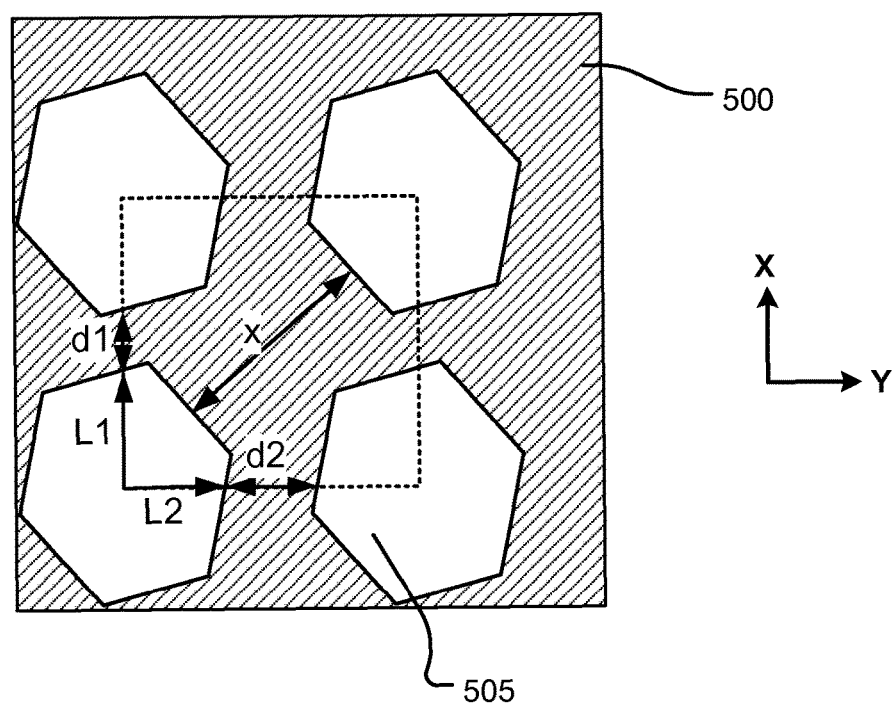

In FIG. 22, the hole 502 is a square or rhombus the dimensions of which can be adjusted as suits a particular implantation. The hole 503 in FIG. 23 is a star configuration, the dimensions of which can be adjusted. The hole 504 in FIG. 24 is a hexagon, the dimensions which can likewise be adjusted for the purposes of tuning the memory cell structure and other aspects of the array. The hole 505 in FIG. 25 is a polygon that has been rotated. The dimensions and amount of rotation can be adjusted for the purposes of tuning the memory cell structure and other aspects of the array.

The buttress structures illustrate include a first array of holes having uniform dimensions, which is desirable for memory cell arrays so that cell operation can be as uniform as possible. Other structures in the memory cell block, like the block shown in FIG. 1, can be formed using the buttress structure as well.

The GSL lines 127, 126 shown in FIG. 1 for example can be replaced by a GSL slice formed using the buttress structure. The GSL slice can be thicker than the word line slices, so that the GSL transistors that result can have longer channel lengths than the memory cells. The thicker slice can be implemented for example by using holes elongated in the channel length dimension (Y-axis) in the first array of holes at the locations of the GSL slice.

Likewise, the SSL gates structures 119, 127 shown in FIG. 1, for example, can be replaced by an SSL slice formed using the buttress structure, and divided into individual gate structures using the second hole etch, or using a separate pattern etch. The SSL slice can be thicker than the word line slices, so that the SSL transistors that result can have longer channel lengths than the memory cells. The thicker slice can be implemented for example by using elongated holes in the first array of holes at the locations of the SSL slice. The source line structures shown in FIG. 1 can also be implemented using separate pattern and contact formation processes as suits the particular implementations.

The bit line pads (e.g. 102B, 103B, 104B, 105B of FIG. 1) can be formed using the semiconductor layers, and patterned as needed during the first and second hole etches, and using stairstep processes for the interlayer conductors.

The shape of the first array of holes as discussed with reference to FIGS. 21-25 is one factor which controls the geometry of memory cells being formed, and other structures in the array block. Another factor relates to the thickness of the semiconductor layers, and the rounding processes applied. Referring to FIG. 17, the shape of the memory cell cross-section 280 can be elliptical, with the long axis of the ellipse in the vertical axis (Z-axis) in the block.

Figure 26:
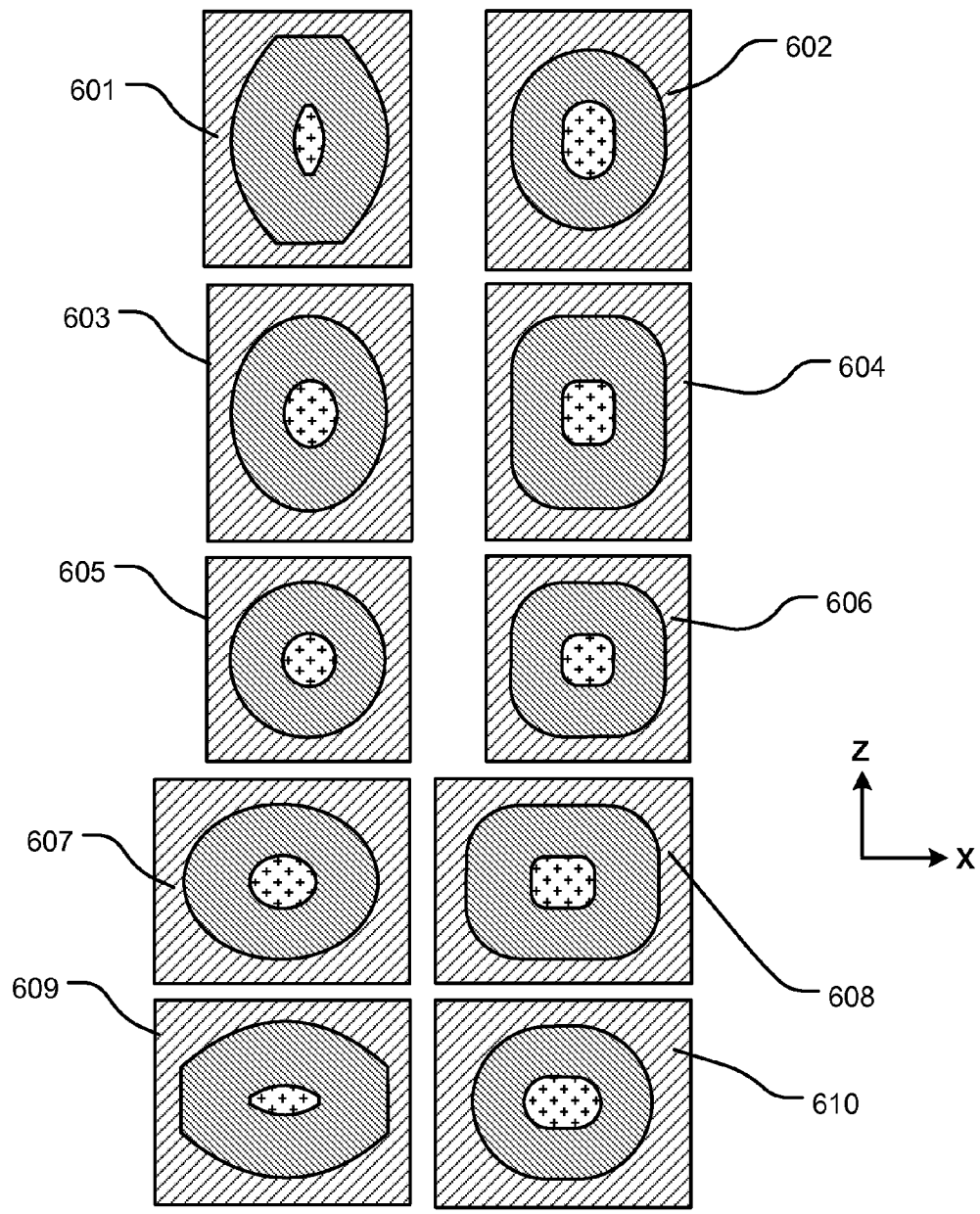
FIG. 26 illustrates a plurality of cross-sectional shapes for the GAA memory cells described herein.

FIG. 26 illustrates a variety of cross-section shapes for the memory cells. The shape 601 is similar to that illustrated in FIG. 17. It can be formed by setting the distance between the holes in the word line direction relatively small relative to the thickness of the semiconductor layer, and applying a rounding process before deposition of the memory layer. The shape 602 is also a vertically aligned ellipse, but is slightly wider than the shape 601. It can be formed by setting the distance between the holes in the word line direction relatively larger than that used to form the shape 601, but still smaller than the thickness of the semiconductor layer. Also, a rounding process may be applied for shorter time.

Shapes 603 and 604 might be formed using the same distance between the holes, but a greater degree of rounding for shape 603, and a lesser degree of rounding for shape 604. Shape 605 represents a circular cross-section, with a shape between the holes and the thickness of the semiconductor layer about the same, and a rounding process is applied that results in the circular shape. The shape 606 could be made using the same configuration of the holes as used to form the shape 605, but applying a lesser degree of rounding so that a rounded square cross-section is formed. Shapes 607 through 610 illustrate embodiments in which the distance between the holes is greater than the thickness of the semiconductor layer, resulting in cross-sectional shapes that are elongated in the horizontal direction. Shape 607 is a relatively well-rounded ellipse. Shape 608 is a rounded rectangle formed using the same starting conditions perhaps as that used for the shape 607, but lesser rounding. The shape 609 can be formed by setting the thickness of an active layer significantly thinner than the distance between the holes, and rounded to form the ellipse. Shape 610 is similar to the shapes 607 and 608, with an amount of rounding that affects only smaller edge portions of the structure.

The cross-sectional shapes of the memory cells, such as those shown in FIG. 26, can be tuned according to the type of memory material, and the programming and erasing operations to be utilized. For example, one feature of the memory structure which is controlled by the cross-sectional shape is the relative intensity of the electric field at the interface between the word line and the outside surface of the memory layer, and at the interface between the inside surface of the memory layer and the channel. The electric field which results from applying a bias between the gate-all-around word line structure and the channel region of the cell is more intense close to the channel surface in rounded portions of the cross-section than in straight portions. Also, the relative difference is greater for structures in which the channel diameter is smaller relative to the outside diameter of the memory layer.

FIG. 27A is a simplified diagram of a stack of semiconductor layers, including layer A, layer B, layer C and layer D, through which holes 451, 452 have been formed, which correspond to the first array of holes discussed above. It is desirable that the holes have perfectly vertical sidewalls. However, for deep high aspect ratio structures, the sidewalls can have a slight angle as illustrated in the diagram. This results in the widths, labeled CD_A, CD_B, CD_C, CD_D, of the semiconductor strips between holes in each of the levels being slightly different. The width CD_D at the bottom of the hole is slightly wider than that CD_A at the top, with slight variations in between. Applying the buttress process described above, and rounding the semiconductor layer, a cross-section such as shown in FIG. 27B can result. As illustrated, the memory cells (421 in the layer A, 422 in the layer B, 423 in the layer C and 424 in the layer D) have different cross-sectional shapes, and different widths. However the heights of the memory cells are about the same. These differences in the structure of the memory cells can result in differences in performance during program and erase operations.

Although not illustrated, the structure of memory cells along a channel strip can be adjusted in the channel width dimension, by adjusting the space between the holes in the first array of holes, such as by using smaller diameter holes along a row in which wider channel widths are to be implemented. For example, NAND cells along a horizontal channel string in a level of the structure may be implemented with wider channel widths near the GSL end of the string, and narrower channel widths near the SSL end of the string, or vice versa.

For example, FIG. 28A illustrates a distribution of threshold voltages for a program operation from an initial low threshold state, in which the cells have relatively close distributions, to a high threshold state, in which layer D, layer C, layer B and layer A have increasingly higher threshold voltage distributions. FIG. 28B illustrates a distribution of threshold voltages for an erase operation from an initial high threshold state, in which the cells have relatively close distributions, to a low threshold state, in which layer D, layer C, layer B and layer A have increasingly lower threshold voltage distributions. These variations in program and erase performance limit the data storage margins for the array, and can require more complex programming and erase algorithms to equalize the threshold distributions.

FIGS. 29A and 29B illustrate more desirable characteristics for program and erase operations. As shown in FIG. 29A, it is desirable that the program operation for cells in all of the layers which increases the threshold from a lower initial state to a higher state, results in more tightly packed distributions as shown. Likewise, FIG. 29B illustrates the more desirable characteristic for an erase operation, or other operation to lower threshold, which results in more tightly packed distributions.

FIG. 30 illustrates how the buttress structure can be used to tune the operational characteristics of the memory cells to assist in achievement of the characteristics shown in FIGS. 29A and 29B. In FIG. 30, a stack of memory cells is shown in cross-section through a word line slice 510. The stack of memory cells includes memory cell 511 in layer A, memory cell 512 in layer B, memory cell 513 in layer C and memory cell 514 in layer D. The operation and structure of the memory cells have been tuned by varying the thicknesses of the semiconductor layers. In this example, the thicknesses of the semiconductor layers increases slightly from the upper layer A to the lower layer D. The memory cell 514 has a width as a result of the slope of the hole type etch which is greater than the width of the cells 513, 512, 511 as discussed above with reference to FIGS. 27A and 27B. However, the memory cell 514 has a depth which is lesser than the depth of at least one of, or all of, the cells 513, 512, 511 above it. This results in tuning of the electric characteristics of the memory cell which can be used to achieve the programming and erasing characteristics shown in FIGS. 29A and 29B. The amount of variation in the thicknesses of the semiconductor layers, or other types of active layers, can be determined empirically, for example, or by performing simulation processes.

Therefore, embodiments of the present technology include memory cells that have different thicknesses in the vertical dimension (height), and different thicknesses in the horizontal dimension (width), where the differences are greater than occur according to normal processing variations, and tend to normalize the electrical characteristics of the memory cells for one or both of the programming and erasing operations applied to the memory cell by an amount which improves the data storage margins or program or erase speed in the array.

Figure 31:
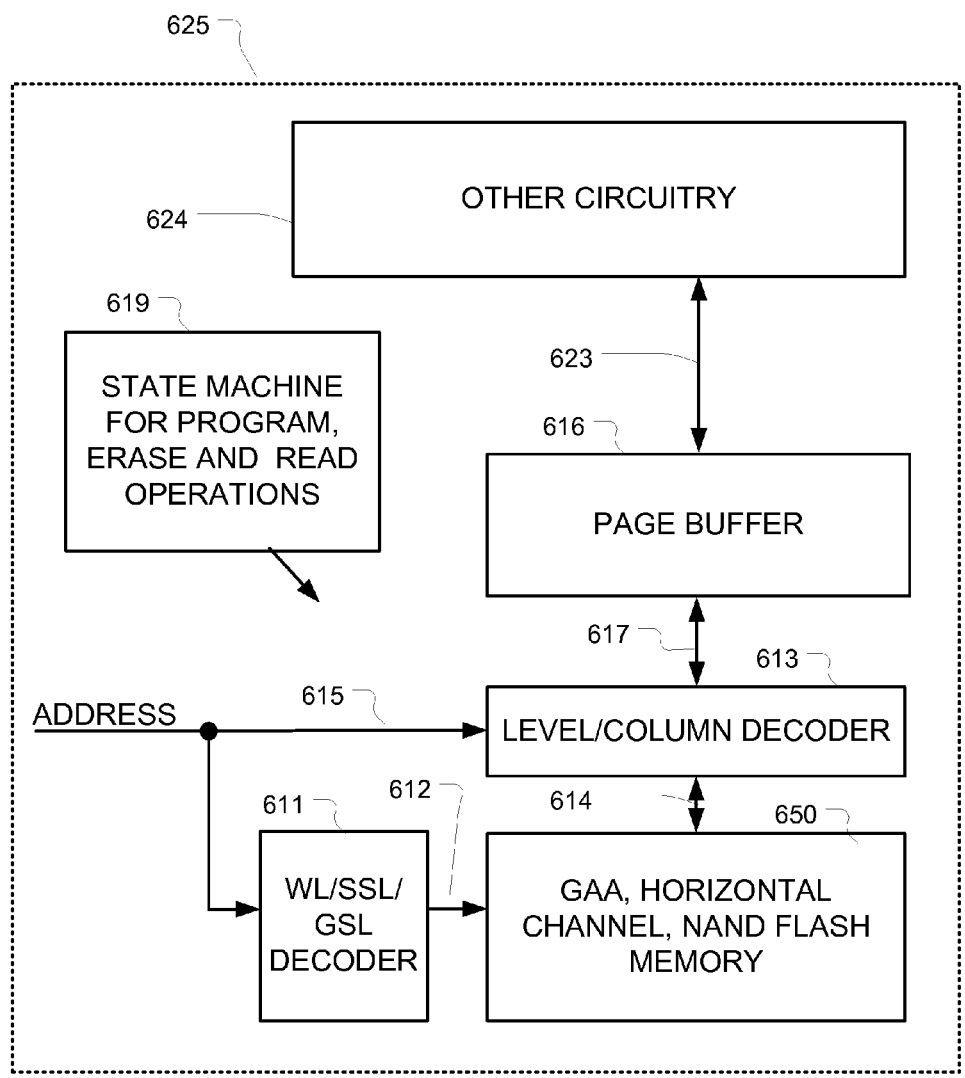
FIG. 31 is a simplified diagram of an integrated circuit memory incorporating GAA, horizontal channel, NAND flash memory as described herein.

FIG. 31 is a simplified block diagram of an integrated circuit 625 including a flash memory array 650 composed of gate-all-around GAA, horizontal channel, NAND flash memory. In some embodiments, the array 650 is a 3D memory and includes multiple levels of cells. A row decoder 611 is coupled to a plurality of word lines, string select lines and ground select lines (612) in the memory array 650. A level/column decoder in block 613 is coupled to a set of page buffers 616, in this example via data bus 617, and to the global bit lines and source lines 614. Addresses are supplied on bus 615 to a level/column decoder (block 613) and a row decoder (block 611). Data is supplied via the data-in line 623 from other circuitry 624 (including for example input/output ports) on the integrated circuit, such as a general purpose processor or special purpose application circuitry, or a combination of modules providing system-on-a-chip functionality supported by the array 650. Data is supplied via the data-in line 623 to input/output ports or to other data destinations internal or external to the integrated circuit 625.

A controller, implemented in this example as a state machine 619, provides signals to control the application of bias arrangement supply voltages generated or provided through the voltage supply circuit to carry out the various operations including erase, program and read. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 32:
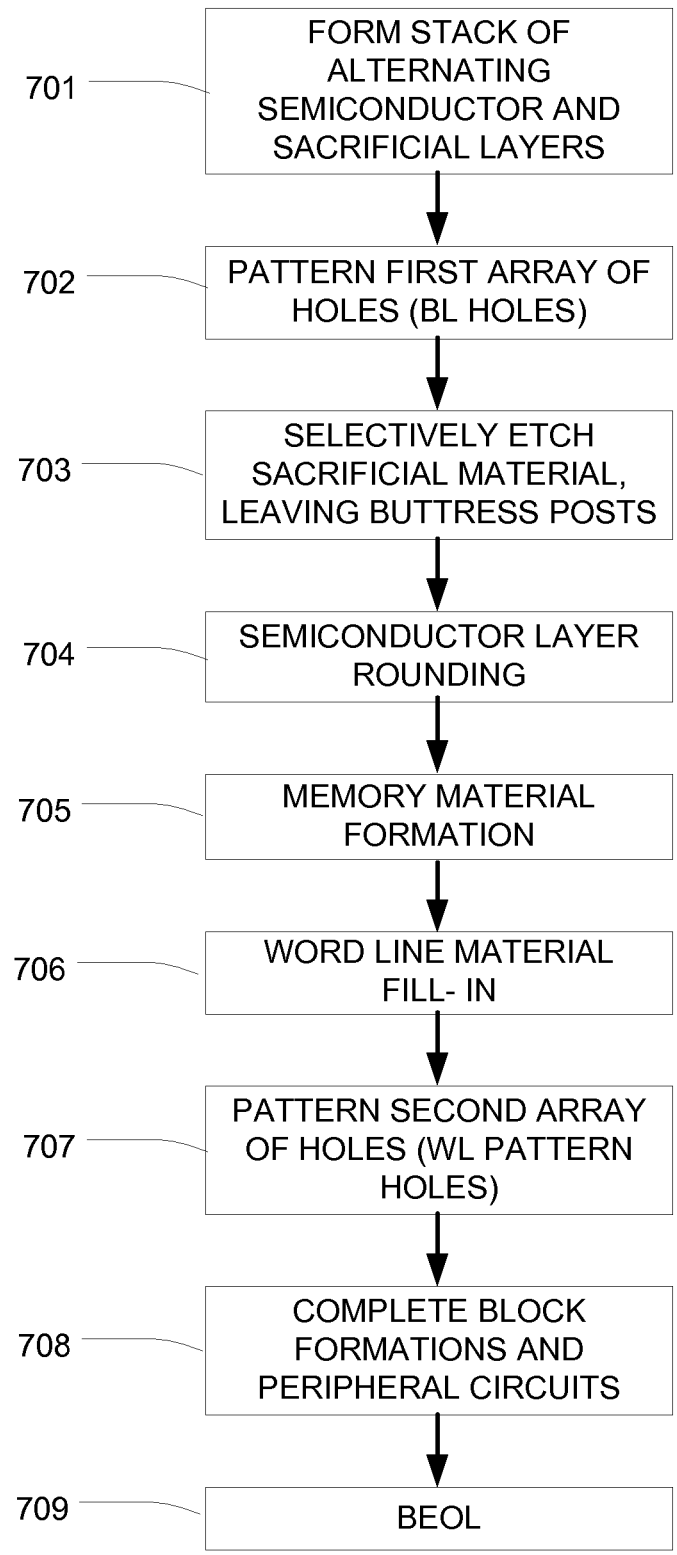
FIG. 32 is a flowchart for a manufacturing process based on a buttress structure as described herein.

FIG. 32 is a flowchart of basic steps in the formation of a 3D, horizontal channel, GAA memory block. In a first block (701) of the flowchart, a stack of alternating semiconductor and sacrificial layers is formed on a substrate. The thickness of the semiconductor layers can be for example about 20 nm. It can be preferred that the thickness be relatively thin, such as about 10 nm, for high density devices and to take advantage of more intense electric field enhancement from the gate-all-around structure. Thus, in some embodiments, the semiconductor layers can be on the order of 10 nm or less. In some cases, it can be preferred that the thickness be relatively thick, such as about 30 nm, for lower resistance of semiconductor strips (higher cell current) and to diminish the read disturb of excess electric field enhancement from the gate-all-around structure. Thus, in some embodiments, the semiconductor layers can be on the order of 30 nm or higher. The optimized semiconductor thickness would be dependent on final device performance since all these factors (device materials, device dimensions, operation conditions) will influence final device performance. In yet other embodiments, the thicknesses of the layers vary in order to tune device performance. For example, a lower layer can have a thickness of about 10 nm, while an upper layer can have a thickness of about 20 nm.

A layer of sacrificial material should be greater than twice the thickness of the memory material to be formed, to allow room for formation of the devices. Thus, in one example, the sacrificial material can comprise a silicon oxide having a thickness of about 50 nm.

In a second block (702) of the flowchart, a first array of holes is patterned. The hole diameter and shape can be tuned as discussed above according to the needs of a particular structure being formed. In one example, the holes can be circular and have a diameter in the range of 60 to 80 nm. In other embodiments, the array of holes can have holes in any suitable shape and including holes with different shapes in the same array, including circular, elliptical, rhomboid and so on. The spacings between the holes can be a factor determining the channel width of the memory cells, and can be in the range of 10 to 30 nm for example. The etching profile for the array of holes should be as vertical as possible in order to provide more uniform memory cell structures. The channel size (NAND string bit line size) of the gate-all-around memory cells is determined by the space between holes and the thickness of the semiconductor layers.

In a third block (703) of the flowchart, a selective etch is executed through the holes to remove the sacrificial material while leaving the buttress posts, as described in detail above, including buttress posts below the bottom patterned active layer. A resulting buttress structure includes passages vertically through the holes, and horizontally in the bit line and word line directions among the posts within which word line material can be deposited.

In a fourth block (704) of the flowchart, a process for rounding the edges of the semiconductor layer, particularly in the regions of the memory cell channels, can be conducted. A variety of processes has been described above for implementing this rounding. The rounding of the memory cell channels can have an important impact on the electric field enhancement characteristics for the memory cell array.

In a fifth block (705) of the flowchart, the memory material is formed within the buttress structure. For a NAND flash, memory material comprises a multilayer dielectric charge trapping structure, such as a BE-SONOS structure, an ONO structure, a MANOS structure or other charge trapping technologies. In one example, a BE-SONOS structure is formed having a nominal thickness of about 20 nm.

In a sixth block (706) of the flowchart, the word line material, such as doped polysilicon, or other active material, is filled in the holes in passages that remain in the buttress structure after formation of the memory film. At this stage, the word line material can fill passages that extend in both the word line and the bit line directions through the buttress structure, and completely surround the memory film on the patterned semiconductor layers.

In a seventh block (707) of the flowchart, a second array of holes is patterned, offset on a line parallel to the bit line direction from the first array of holes, to sever the word line material in the passages that extend in the bit line direction, thereby forming vertical slices or walls which act as gate-all-around word lines and are penetrated by the horizontal active lines, which in this example are NAND string bit lines. The second array of holes also severs the extensions of the semiconductor layers that proceed in the word line direction, thereby isolating the individual strips of semiconductor material along the NAND strings in each layer. In this process example, the posts of the buttress structure remain distributed along the strips of semiconductor material that act as the channel lines for the NAND strings, and extend between the individual strips of semiconductor material in adjacent levels in portions of the block structure between the memory cells.

The diameter of the hole type etches in the second array in the illustrated example can be on the order of 40 to 60 nm, for example, to separate the bit lines and the word lines in the memory embodiment. The size of the holes in the second array, at least in the memory cell area, is dependent on the bit line dimension and the gate-all-around word line size. The second array of holes can have holes in any suitable shape and including holes with different shapes in the same array, including circular, elliptical, rhomboid and so on. In some embodiments, additional treatments can be executed through the second array of holes, such as re-oxidation, trimming of the polysilicon of the word lines or channels, trimming of the memory material and so on if desired.

In an eighth block (708) of the flowchart, steps required to complete other formations for the memory cell block, including the SSL structures, the GSL structures, the source line contacts, and the bit line pads are executed. Also, the steps required to complete peripheral circuits are mentioned. Of course, the order in which these additional steps for completion of other formations in the block and of the peripheral circuits are performed can be chosen for the purposes of a particular manufacturing sequence.

In a ninth block (709), the flowchart, the back end of line BEOL steps are identified. These steps are performed to provide for overlying patterned metal layers and other structures needed for completion of the integrated circuit.

The technology herein includes a process to use two hole patterning steps through a stack of alternating active layers (e.g. semiconductor) and sacrificial layers (e.g. insulator) to define both bit line and word line structures for a vertical memory device, having horizontal channels and vertical gates. The first hole patterning step can define the "memory cell size" or channel length and width for each cell, avoiding the high aspect ratio line type etch, which can suffer line bending or wiggling issues.

The technology described herein includes a process to use a high selectivity isotropic etch to remove parts of sacrificial layers while leaving an array of posts which, together with active layers, form a buttress for sustaining the structure during the subsequent process to form a GAA structure.

A rounding process can be conducted either before or after insulating buttress formation, allowing the formation of a rounded shape for the memory cell channels, which can be a significant factor on device performance.

Memory material (e.g. ONO) and conductive material (e.g. polysilicon) for word line formation are then filled in, through the first hole pattern to form the GAA structure.

The second hole patterning separates extensions in the active layers connecting bit lines and the word line conductive material to form word lines. As a result, an array of horizontal channel, GAA NAND flash cells can be formed. Also, other types of memory materials may be used as discussed above, for formation of a variety array types.

Based on this twice hole patterning, the memory cells can be implemented with a compact $4F^2$ foot print.

A horizontal channel, gate-all-around flash memory cell is described. This memory cell structure can be implemented in a single 2D array, or act as a foundation of a 3D memory structure. The 2D array and the 3D memory structure can comprise a horizontal channel, gate-all-around NAND array. The manufacturing method and array structure can be applied for other types of memory technologies, by for example replacing the dielectric charge trapping memory material with programmable resistance memory material.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
    a plurality of stacks of horizontal active lines that comprise portions of layers of material in a plurality of levels, the portions of the layers forming the horizontal active lines having sides defined by rows and columns of holes in an array of holes that penetrate the layers of material;
    a buttress including a plurality of insulating posts extending vertically between horizontal active lines in the plurality of stacks, each insulating post in the plurality of insulating posts being disposed between and recessed away from perimeters of adjacent holes in two columns and two rows of the array;
    a plurality of vertical slices penetrated by, and surrounding, the horizontal active lines disposed between the rows of holes in the array of holes; and
    a memory film between the horizontal active lines in the plurality of stacks and the vertical slices in the plurality of vertical slices.

2. The memory device of claim 1, wherein the horizontal active lines comprise semiconductor channel lines, and the vertical slices comprise conductive word lines which surround the horizontal active lines.

3. The memory device of claim 1, wherein the memory film comprises a multilayer, dielectric charge trapping structure, the horizontal active lines comprise a semiconductor, and the vertical slices comprise a conductive material.

4. The memory device of claim 1, wherein at least one of the horizontal active lines has a thickness in a vertical dimension different from that of at least another of the horizontal active lines in the same stack.

5. The memory device of claim 1, wherein the horizontal active lines have opposing sides with undulating shapes more narrow near a center of the vertical slices than near edges of the vertical slices.

6. The memory device of claim 1, wherein the horizontal active lines are silicon, and the memory film comprises a multilayer, dielectric charge trapping structure.

7. The memory device of claim 1, wherein the plurality of horizontal active lines have rounded surfaces where they penetrate the plurality of vertical slices.

8. A memory device, comprising:
    a horizontal active line that comprises portions of a layer of material having sides defined by rows and columns of holes in an array of holes that penetrate the layer of material;
    a buttress including a plurality of insulating posts extending vertically from an upper surface of the horizontal active line, each insulating post in the plurality of insulating posts being disposed between and recessed away from perimeters of adjacent holes in two columns and two rows of the array;
    a dielectric charge trapping structure surrounding the horizontal channel line; and
    a gate all around the dielectric charge trapping structure and the horizontal channel line.

9. The memory device of claim 8, wherein the horizontal active line has a rounded surface where it is surrounded by the dielectric charge trapping structure.

10. A memory device, comprising:
    a 3D block of horizontal channel, vertical gate-all-around flash memory cells, wherein the 3D block comprises:
    a plurality of stacks of horizontal NAND bit line strips that comprise portions of layers of semiconductor material in a plurality of levels, the portions of the layers forming the horizontal bit line strips having sides defined by rows and columns of holes in an array of holes that penetrate the layers of material;
    a buttress including a plurality of insulating posts extending vertically between horizontal bit line strips in the plurality of stacks, each insulating post in the plurality of insulating posts being disposed between and recessed away from perimeters of adjacent holes in two columns and two rows of the array;
    a plurality of vertical word line slices penetrated by, and surrounding, the horizontal NAND bit line strips, and disposed between the rows of holes in the array of holes; and a dielectric charge trapping structure between the horizontal NAND bit line strips in the plurality of stacks and the vertical slices in the plurality of vertical word line slices.

11. The memory device of claim 10, wherein at least one of the horizontal NAND bit line strips has a thickness in a vertical dimension different from that of at least another of the horizontal NAND bit line strips in the same stack.

12. The memory device of claim 10, wherein the horizontal NAND bit line strips are silicon.

13. The memory device of claim 10, wherein the plurality of horizontal NAND bit line strips have rounded surfaces where they penetrate the plurality of word line vertical slices.

14. The memory device of claim 10, wherein the bit line strips have opposing sides with undulating shapes more narrow near a center of the vertical word line slices than near edges of the vertical word line slices.

15. A method for manufacturing a memory, comprising:
forming a plurality of stacks of horizontal active lines that comprise portions of layers of material in a plurality of levels, the portions of the layers forming the horizontal active lines having sides defined by rows and columns of holes in an array of holes that penetrate the layers of material;
forming a buttress including a plurality of insulating posts extending vertically between horizontal active lines in the plurality of stacks, each insulating post in the plurality of insulating posts being disposed between and recessed away from perimeters of adjacent holes in two columns and two rows of the array;
forming a plurality of vertical slices penetrated by, and surrounding, the horizontal active lines disposed between the rows of holes in the array of holes; and
forming a memory film between the horizontal active lines in the plurality of stacks and the vertical slices in the plurality of vertical slices.

16. The memory device of claim 1, wherein the posts in the plurality of posts are disposed centrally in a diagonal direction on the portions of the layers between perimeters of adjacent holes in two columns and two rows of the array.

17. The memory device of claim 8, wherein the posts in the plurality of posts are disposed centrally in a diagonal direction on the portions of the horizontal active line between perimeters of adjacent holes in two columns and two rows of the array.

18. The memory device of claim 8, wherein the horizontal active line has opposing sides with undulating shapes more narrow near a center of the gate than near edges of the gate.

19. The memory device of claim 10, wherein the posts in the plurality of posts are disposed centrally in a diagonal direction on the portions of the layers between perimeters of adjacent holes in two columns and two rows of the array.

20. The method of claim 15, wherein the posts in the plurality of posts are disposed centrally in a diagonal direction on the portions of the layers between perimeters of adjacent holes in two columns and two rows of the array.

* * * * *